(12) United States Patent
Liu et al.

(10) Patent No.: US 12,362,665 B2
(45) Date of Patent: Jul. 15, 2025

(54) POWER CONVERTER FOR REDUCING SWITCHING LOSS AND ENHANCING SYSTEM EFFICIENCY AND CONTROL METHOD THEREOF

(71) Applicant: RICHTEK TECHNOLOGY CORP., Hsinchu County (TW)

(72) Inventors: Kuo-Chi Liu, Hsinchu (TW); Ta-Yung Yang, Taoyuan (TW); Wei-Hsu Chang, New Taipei (TW)

(73) Assignee: RICHTEK TECHNOLOGY CORP., Hsinchu County (TW)

( * ) Notice: Subject to any disclaimer, the term of this patent is extended or adjusted under 35 U.S.C. 154(b) by 267 days.

(21) Appl. No.: 18/131,361

(22) Filed: Apr. 5, 2023

(65) Prior Publication Data

US 2023/0336075 A1    Oct. 19, 2023

Related U.S. Application Data

(60) Provisional application No. 63/332,279, filed on Apr. 19, 2022.

(30) Foreign Application Priority Data

Nov. 1, 2022    (TW) .................................. 111141597

(51) Int. Cl.
*H02M 3/07* (2006.01)
*H02M 1/00* (2006.01)
*H03K 19/20* (2006.01)

(52) U.S. Cl.
CPC ............ *H02M 3/07* (2013.01); *H02M 1/0012* (2021.05); *H02M 1/0058* (2021.05); *H03K 19/20* (2013.01)

(58) Field of Classification Search
CPC .......... H02M 3/07; H02M 3/01; H02M 3/072; H02M 3/4837; H02M 3/158;
(Continued)

(56) References Cited

U.S. PATENT DOCUMENTS 9,917,517 B1    3/2018  Jiang
11,228,256 B2 *  1/2022  Zilio ..................... H02M 3/158
(Continued)

OTHER PUBLICATIONS

Yousefzadeh et al., Three-Level Buck Converter for Envelope Tracking in RF Power Amplifiers, Twentieth Annual IEEE Applied Power Electronics Conference and Exposition, pp. 1588-1594, 2005.

(Continued)

*Primary Examiner* — Monica Lewis
*Assistant Examiner* — Jye-June Lee
(74) *Attorney, Agent, or Firm* — Winston Hsu

(57) ABSTRACT

A power converter includes first to fourth switches, a flying capacitor, an inductor, an output capacitor and a control circuit. The first to fourth switches are sequentially coupled in cascode. The first switch receives an input voltage, and the fourth switch is further coupled to a ground terminal. The flying capacitor is coupled across the second switch and the third switch, the inductor is coupled to the second switch, the third switch and the output capacitor. The output capacitor is used to output an output voltage. In a non-regulated mode, the control circuit switches the first to fourth switches according to a resonant frequency. In a regulated mode, the control circuit switches the first to fourth switches according to a regulated frequency exceeding the resonant frequency. When the flying capacitor is coupled to the inductor, the flying capacitor and the inductor can form a resonant circuit having the resonant frequency.

26 Claims, 12 Drawing Sheets

(58) Field of Classification Search
CPC ............. H02M 1/0012; H02M 1/0058; H02M 1/0025; H02M 1/0032; H02M 1/0095; H03K 19/20; Y02B 70/10
See application file for complete search history.

(56) References Cited

U.S. PATENT DOCUMENTS

2015/0311784 A1   10/2015  Saadat
2021/0067042 A1*  3/2021  Liu ..................... H02M 7/4837
2021/0119465 A1   4/2021  Choi
2021/0399621 A1*  12/2021  Liu ........................ H02M 3/01

OTHER PUBLICATIONS

Liu, the specification, including the claims, and drawings in the U.S. Appl. No. 18/123,961, filed Mar. 20, 2023.

* cited by examiner

POWER CONVERTER FOR REDUCING SWITCHING LOSS AND ENHANCING SYSTEM EFFICIENCY AND CONTROL METHOD THEREOF

CROSS REFERENCE TO RELATED APPLICATIONS

This application claims the benefit of U.S. Provisional Application No. 63/332,279, filed on Apr. 19, 2022. The content of the application is incorporated herein by reference.

BACKGROUND OF THE INVENTION

1. Field of the Invention

The invention relates to power conversion, and in particular, to a power converter for reducing switching loss and enhancing system efficiency and a control method thereof.

2. Description of the Prior Art

A resonant switched-capacitor converter (RSCC) is a power converter that consumes limited or no power during power transfer, and provides power to portable devices such as mobile phones and notebook computers.

The resonant switched-capacitor converter converts an input voltage to an output voltage using a fixed conversion ratio. When the input voltage is too large, the resonant switched-capacitor converter would continue to generate an excessively large output voltage using the fixed conversion ratio, resulting in damage to an electronic device. When the input voltage is insufficient, the resonant switched-capacitor converter would generate an insufficient output voltage using the fixed conversion ratio, resulting in degradation in the circuit efficiency.

SUMMARY OF THE INVENTION

According to an embodiment of the invention, a power converter includes a first switch, a second switch, a third switch, a fourth switch, a flying capacitor, an inductor, an output capacitor and a control circuit. The first switch includes a control terminal, a first terminal configured to receive an input voltage, and a second terminal. The second switch includes a control terminal, a first terminal coupled to the second terminal of the first switch, and a second terminal. The third switch includes a control terminal, a first terminal coupled to the second terminal of the second switch, and a second terminal. The fourth switch includes a control terminal, a first terminal coupled to the second terminal of the third switch, and a second terminal coupled to a ground terminal. The flying capacitor includes a first terminal coupled to the second terminal of the first switch, and a second terminal coupled to the second terminal of the third switch. The inductor includes a first terminal coupled to the second terminal of the second switch, and a second terminal. The output capacitor includes a first terminal coupled to the second terminal of the inductor and configured to output an output voltage, and a second terminal coupled to the ground terminal. The control circuit is coupled to the first terminal of the first switch, the control terminal of the first switch, the control terminal of the second switch, the control terminal of the third switch and the control terminal of the fourth switch. The control circuit is used to switch the first switch, the second switch, the third switch and the fourth switch according to a resonant frequency in a non-regulated mode, and switch the first switch, the second switch, the third switch and the fourth switch according to a regulated frequency exceeding the resonant frequency in a regulated mode. When the flying capacitor is coupled to the inductor, the flying capacitor and the inductor form a resonant circuit having the resonant frequency.

According to another embodiment of the invention, a power converter includes a first switch, a second switch, a third switch, a fourth switch, a flying capacitor, an inductor, an output capacitor and a control circuit. The first switch includes a control terminal, a first terminal configured to receive an input voltage, and a second terminal. The second switch includes a control terminal, a first terminal coupled to the second terminal of the first switch, and a second terminal. The third switch includes a control terminal, a first terminal coupled to the second terminal of the second switch, and a second terminal. The fourth switch includes a control terminal, a first terminal coupled to the second terminal of the third switch, and a second terminal coupled to a ground terminal. The flying capacitor includes a first terminal coupled to the second terminal of the first switch, and a second terminal coupled to the second terminal of the third switch. The inductor includes a first terminal coupled to the second terminal of the second switch, and a second terminal. The output capacitor includes a first terminal coupled to the second terminal of the inductor and configured to output an output voltage, and a second terminal coupled to the ground terminal. The control circuit is coupled to the first terminal of the first switch, the control terminal of the first switch, the control terminal of the second switch, the control terminal of the third switch and the control terminal of the fourth switch. The method includes in a non-regulated mode, the control circuit switching the first switch, the second switch, the third switch and the fourth switch according to a resonant frequency, and in a regulated mode, the control circuit switching the first switch, the second switch, the third switch and the fourth switch according to a regulated frequency exceeding the resonant frequency. When the flying capacitor is coupled to the inductor, the flying capacitor and the inductor form a resonant circuit having the resonant frequency.

These and other objectives of the present invention will no doubt become obvious to those of ordinary skill in the art after reading the following detailed description of the preferred embodiment that is illustrated in the various figures and drawings.

DETAILED DESCRIPTION

Figures 1, 2:
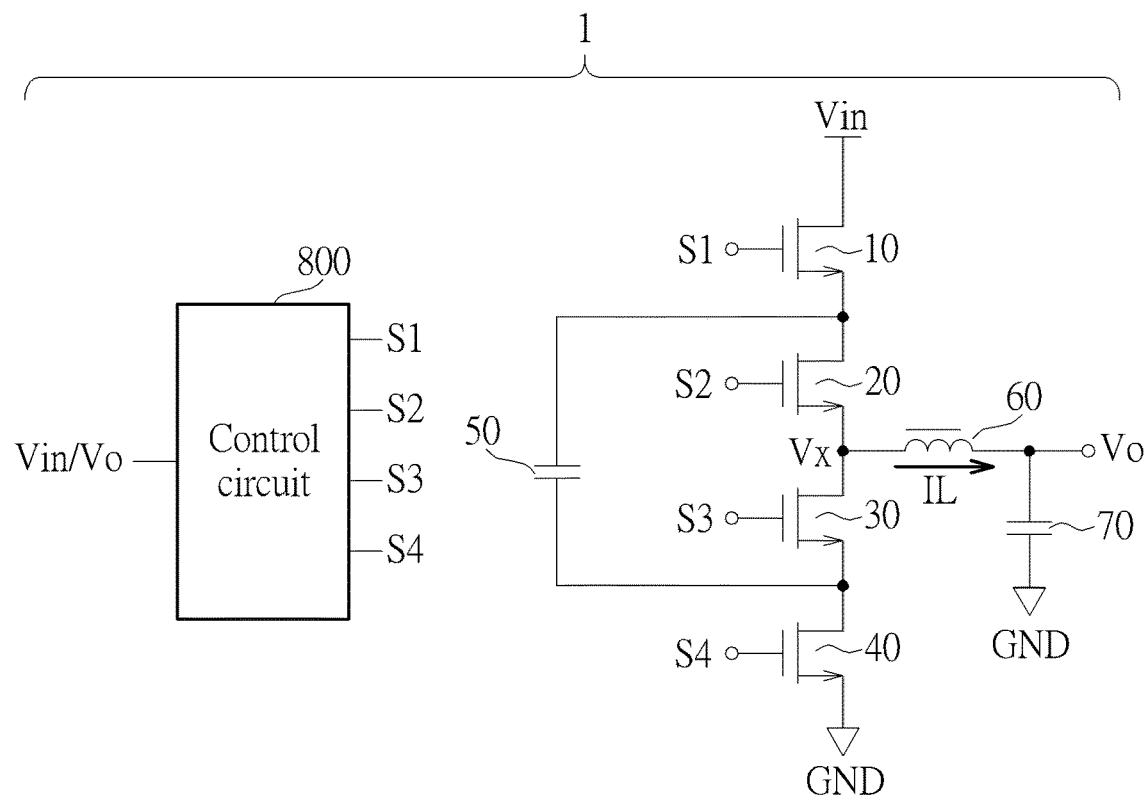
FIG. 1 is a circuit schematic of a power converter according to an embodiment of the invention.
FIG. 2 is a flowchart of a method of controlling the power converter in FIG. 1.

FIG. 1 is a circuit schematic of a power converter 1 according to an embodiment of the invention. The power converter 1 may step down the input voltage Vin to generate an output voltage Vo to the load. Both the input voltage Vin and the output voltage Vo may be DC voltages, and the output voltage Vo may be less than or equal to the input voltage Vin. The power converter 1 may operate in a non-regulated mode or a regulated mode. The power converter 1 may operate in a discontinuous conduction mode (DCM) but not in a continuous conduction mode (CCM) regardless of operating in the non-regulated mode or the regulated mode.

When the input voltage Vin is between a low voltage threshold and a high voltage threshold, the power converter 1 may be operated in a non-regulated mode, and the high voltage threshold may be greater than the low voltage threshold. When operating in the non-regulated mode, the power converter 1 may be regarded as a voltage divider, and the output voltage Vo may be a divided voltage of the input voltage Vin. In some embodiments, the output voltage Vo may be equal to half of the input voltage Vin in the non-regulated mode. When the input voltage Vin is less than the low voltage threshold or exceeds the high voltage threshold, the power converter 1 may be operated in a regulated mode, so as to maintain the output voltage Vo within a reasonable range without being too high or too low. The regulated mode may be implemented by a single-phase operation or a two-phase operation. When the input voltage Vin is less than the low voltage threshold, the power converter 1 may perform the single-phase operation to regulate the output voltage Vo to less than or equal to the input voltage Vin. In the single-phase operation, the power converter 1 may be regarded as a buck converter. When the input voltage Vin exceeds the high voltage threshold, the power converter 1 may perform the two-phase operation to regulate the output voltage Vo to less than or equal to a maximum output voltage. In some embodiments, the maximum output voltage may be equal to half the high voltage threshold. For example, if the high voltage threshold is 40V, the low voltage threshold is 20V, and the maximum output voltage is 20V, when the input voltage Vin is equal to 30V, the power converter 1 may generate an output voltage Vo of 15V. When the input voltage Vin is equal to 10V, the power converter 1 may adjust the output voltage Vo to 10V. When the input voltage Vin is equal to 60V, the power converter 1 may adjust the output voltage Vo to 20V so as to prevent damage to the load and enhance system efficiency.

The power converter 1 may include a switch 10, a switch 20, a switch 30, a switch 40, a flying capacitor 50, an inductor 60, an output capacitor 70 and a control circuit 800. The switch 10 includes a control terminal configured to receive a switch signal S1, a first terminal, and a second terminal. The switch 20 includes a control terminal configured to receive a switch signal S2, a first terminal coupled to the second terminal of the switch 10, and a second terminal. The switch 30 includes a control terminal config- ured to receive a switch signal S3, a first terminal coupled to the second terminal of the switch 20, and a second terminal. The switch 40 includes a control terminal config- ured to receive a switch signal S4, a first terminal coupled to the second terminal of the switch 30, and a second terminal coupled to a ground terminal. The flying capacitor 50 includes a first terminal coupled to the second terminal of the switch 10, and a second terminal coupled to the second terminal of the switch 30. The inductor 60 includes a first terminal coupled to the second terminal of the switch 20, and a second terminal. The output capacitor 70 includes a first terminal coupled to the second terminal of the switch 60, and a second terminal coupled to the ground terminal. The control circuit 800 may be coupled to the control terminal of the switch 10, the control terminal of the switch 20, the control terminal of the switch 30 and the control terminal of the switch 40.

The first terminal of the switch 10 may receive the input voltage Vin, and the first terminal of the output capacitor 70 may output the output voltage Vo. The ground terminal may provide a ground voltage GND such as 0V. The second terminal of the switch 20 may provide a switching voltage Vx. The current flowing through the inductor 60 may be referred to as an inductor current IL. When the inductor current IL flows from the first terminal of the inductor 60 to the second terminal of the inductor 60, the inductor current IL is referred to as a positive current; and when the inductor current IL flows from the second terminal of the inductor 60 to the first terminal of the inductor 60, the inductor current IL IL is referred to as a negative current.

The control circuit 800 may receive the input voltage Vin and/or the output voltage Vo to generate switch signals S1 to S4 for switching the switches 10, 20, 30 and 40, respectively, so as to configure the power converter 1 to the regulated mode or the non-regulated mode. FIG. 2 is a flowchart of a method 200 of controlling the power converter 1, adaptable by the control circuit 800. The method 200 includes Steps S202 and S204 for the control circuit 800 to operate the power converter 1 in the non-regulated mode or the regu- lated mode. Any reasonable step change or adjustment is within the scope of the disclosure. Steps S202 and S204 are explained as follows:

Step S202: In the non-regulated mode, the control circuit 800 switches the switches 10, 20, 30 and 40 according to a resonant frequency;

Step S204: In the regulated mode, the control circuit 800 switches the switches 10, 20, 30 and 40 according to a regulated frequency exceeding the resonant frequency.

In Step S202, the power converter 1 is operated in the non-regulated mode, and the control circuit 800 switches the switches 10, 20, 30 and 40 to couple the flying capacitor 50 to the output capacitor 70 via the inductor 60, so as to form a voltage divider to generate an output voltage Vo according to the input voltage Vin while enabling the flying capacitor 50 and the inductor 60 to form a resonant circuit. The resonant circuit may generate the resonant frequency, and the control circuit 800 switches the switches 10, 20, 30, and 40 according to the resonant frequency when the inductor current is 0 to generate a divided voltage of the input voltage Vin as the output voltage Vo, thereby achieving zero-current switching (ZCS). The switch signals S1 and S3 may be the same to switch the switches 10 and 30 simultaneously according to the resonant frequency, and the switch signals S2 and S4 may be the same to switch the switches 20 and 40 simultaneously according to the resonant frequency. In gen- eral, the power converter 1 may alternately operate in the first phase Ph1 and the second phase Ph2 as shown in FIG.

3. In the first phase Ph1, the switches 10 and 30 are turned on and the switches 20 and 40 are turned off. In the second phase Ph2, the switches 20 and 40 are turned on and the switches 10 and 30 are turned off.

Figure 3:
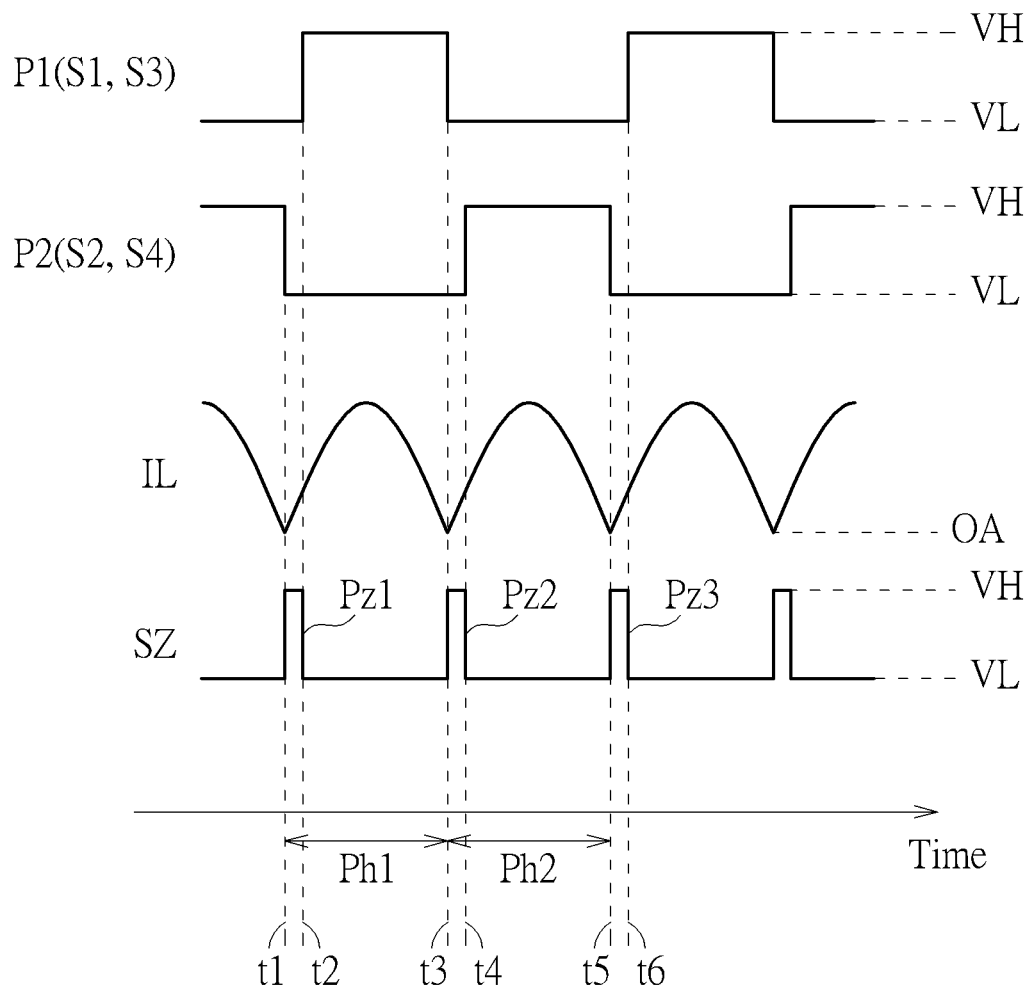
FIG. 3 shows waveforms of the power converter in FIG. 1 in a non-regulated mode.

FIG. 3 shows waveforms of the power converter 1 in the non-regulated mode, where the horizontal axis represents time and the vertical axis represents voltage or current. The operations of the non-regulated mode for the power converter 1 will be described below with reference to both FIG. 1 and FIG. 3. In the non-regulated mode, the control circuit 800 may use a phase signal P1 to generate the switch signals S1 and S3, use a phase signal P2 to generate the switch signals S2 and S4, generate a zero-crossing signal SZ according to the inductor current IL, and switch the phase signals P1 and P2 according to the zero-crossing signal SZ. The zero-crossing signal SZ may be generated when the detected inductor current IL is 0 A. The phase signal P1 and the switch signals S1 and S3 may be identical, and the phase signal P2 and the switch signals S2 and S4 may be identical. The generation of the zero-crossing signal SZ and the phase signals P1 and P2 will be explained in detail in the following paragraphs.

At Time t1, the inductor current IL reaches 0 A, triggering the generation of a pulse Pz1 in the zero-crossing signal SZ. The pulse Pz1 triggers the phase signal P2 to switch from a high voltage VH to a low voltage VL, while the phase signal P1 remains at the low voltage VL. The low voltage VL may be the ground voltage GND. At Time t2, the phase signal P1 switches from the low voltage VL to the high voltage VH, the phase signal P2 remains at the low voltage VL, and the pulse Pz1 ends. The pulse Pz1 may have a predetermined width, e.g, equal to (t2–t1).

Between Time t2 and Time t3, the phase signal P1 is maintained at the high voltage VH, the phase signal P2 is maintained at the low voltage VL, the inductor current IL resonates at the resonant frequency, and the zero-crossing signal SZ is maintained at the low voltage VL. The switch signals S1 and S3 (=phase signal P1) may be the high voltage VH to turn on the switches 10 and 30, and the switch signals S2 and S4 (=phase signal P2) may be the low voltage VL to turn off the switches 20 and 40, thereby enabling the first terminal of the flying capacitor 50 to receive the input voltage Vin via the switch 10, and coupling the second terminal of the flying capacitor 50 to the first terminal of the inductor 60 via the switch 30. Therefore, the input voltage Vin charges the flying capacitor 50 and the output capacitor 70 and magnetizes/demagnetizes the inductor L via the inductor 60. Meanwhile, the flying capacitor 50 and the output capacitor 70 may form a voltage divider to generate the output voltage Vo, and the flying capacitor 50 and the inductor L 60 may form a resonant circuit to enable the inductor current IL to resonate at the resonant frequency. In some embodiments, the capacitances of the flying capacitor 50 and the output capacitor 70 may be equal, resulting in equal voltages across the flying capacitor 50 and the output capacitor 70, and setting the switching voltage Vx and the output voltage Vo both to equal to half the input voltage Vin.

At Time t3, the inductor current IL reaches 0 A, triggering the generation of a pulse Pz2 in the zero-crossing signal SZ. The pulse Pz2 triggers the phase signal P1 to switch from a high voltage VH to a low voltage VL, while the phase signal P2 remains at the low voltage VL. At Time t4, the phase signal P2 switches from the low voltage VL to the high voltage VH, the phase signal P1 remains at the low voltage VL, and the pulse Pz2 ends. The pulse Pz2 may have the same predetermined width as the pulse Pz1, e.g, the predetermined width (t4–t3) of the pulse Pz2 is equal to the predetermined width (t2–t1) of the pulse Pz1. The period between time t1 and t3 is referred to as the first phase Ph1.

Between Time t4 and Time t5, the phase signal P1 is maintained at the low voltage VL, the phase signal P2 is maintained at the high voltage VH, the inductor current IL resonates at the resonant frequency, and the zero-crossing signal SZ is maintained at the low voltage VL. The switch signals S1 and S3 (=phase signal P1) may be set to the low voltage VL to turn off the switches 10 and 30, and the switch signals S2 and S4 may be set to the high voltage VH to turn on the switches 20 and 40, thereby coupling the first terminal of the flying capacitor 50 to the first terminal of the inductor 60 via the switch 20, and coupling the second terminal of the flying capacitor 50 to the ground terminal via the switch 40. The flying capacitor 50 may be used as a voltage source to charge the output capacitor 70 and magnetize the inductor L, and thus, the voltage across the flying capacitor 50 may be equal to the output voltage Vo. If the voltage across the flying capacitor 50 is equal to half the input voltage Vin, the output voltage Vo is also equal to half of the input voltage Vin. Meanwhile, the flying capacitor 50 and the inductor 60 may form the resonant circuit to enable the inductor current IL to resonate at the resonant frequency.

At Time t5, the inductor current IL reaches 0 A, triggering the generation of a pulse Pz3 in the zero-crossing signal SZ. The pulse Pz3 triggers the phase signal P2 to switch from the high voltage VH to the low voltage VL, while the phase signal P1 remains at the low voltage VL. At Time t6, the phase signal P1 switches from the low voltage VL to the high voltage VH, the phase signal P2 remains at the low voltage VL, and the pulse Pz3 ends. The pulse Pz3 may have the same predetermined width as the pulse Pz1, e.g, the predetermined width (t6–t5) of the pulse Pz3 is equal to the predetermined width (t2–t1) of the pulse Pz1. The period between time t3 and t5 is referred to as the second phase Ph2.

Later, if the control circuit 800 continues to determine that the power converter 1 may operate in the non-regulated mode, the power converter 1 will continue to switch the switches 10, 20, 30 and 40 according to the resonant frequency to repeat the waveform from Time t2 to Time t6, so as to output the voltage Vo to the load.

Figure 4:
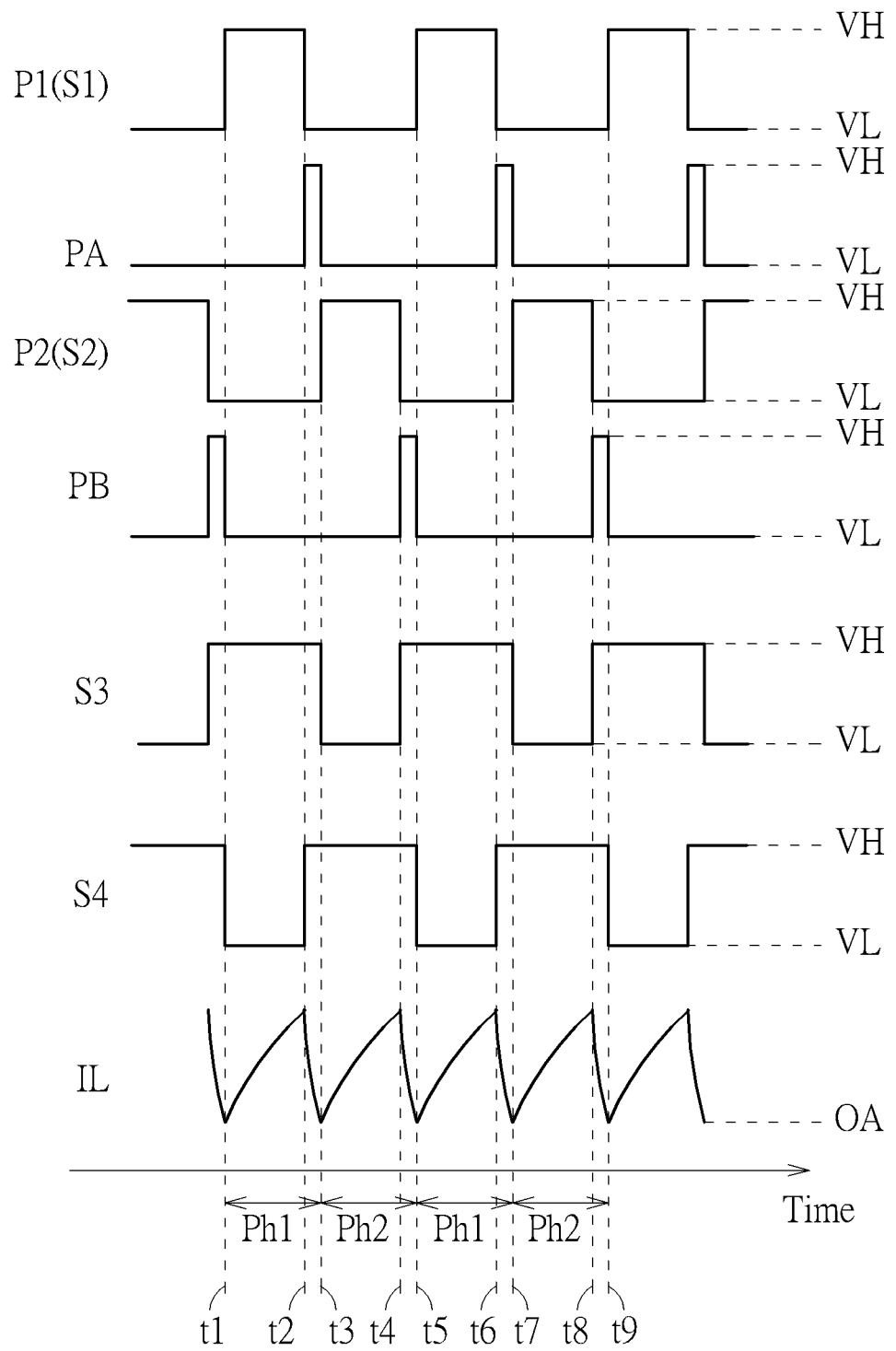
FIG. 4 shows waveforms of the power converter in FIG. 1 in a two-phase operation.
Figure 5:
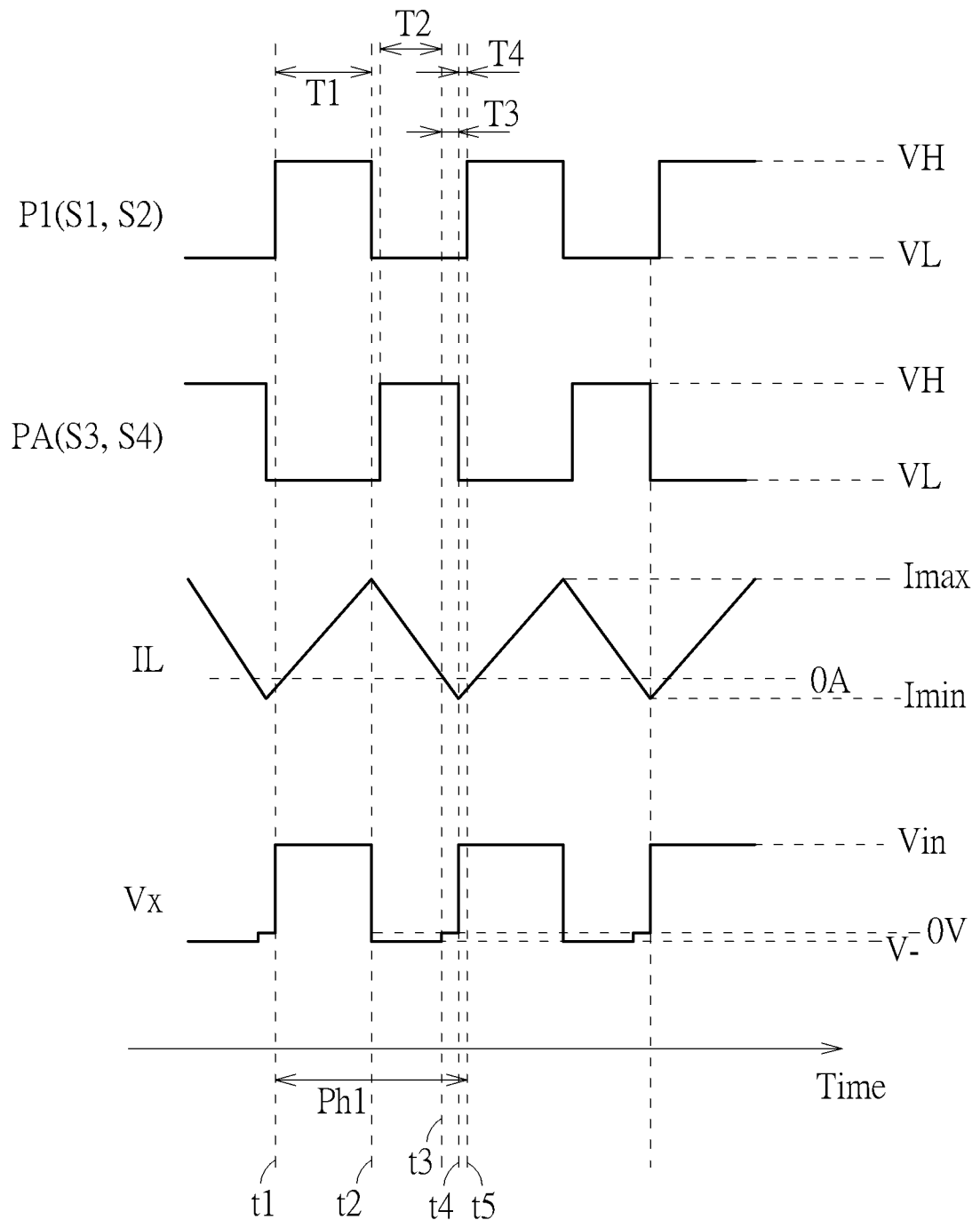
FIG. 5 shows waveforms of the power converter in FIG. 1 in a single-phase operation.

In Step S204, the power converter 1 is operated in regulated mode. During the two-phase operation, the switch signals S1 to S4 may be different, and the power converter 1 may operate in the first stage Ph1 and the second stage Ph2 in turn as shown in FIG. 4. FIG. 4 will be detailed in the following paragraphs. In the single-phase operation, the switch signals S1 and S2 may be the same to switch the switches 10 and 20 simultaneously, and the switch signals S3 and S4 may be the same to switch the switches 30 and 40 simultaneously, and the power converter 1 may be operated in the first phase Ph1 repeatedly as shown in FIG. 5. FIG. 5 will be detailed in the subsequent paragraphs.

FIG. 4 shows waveforms of the power converter 1 in the two-phase operation, wherein the horizontal axis represents time and the vertical axis represents voltage or current. The two-phase operation for the power converter 1 will be explained below with reference to both FIG. 1 and FIG. 4. The control circuit 800 may generate the switch signal S1 according to the phase signal P1, generate the switch signal S2 according to the phase signal P2, generate the switch signal S3 according to the phase signals P1, PA and PB, and generate the switch signal S4 according to the phase signals P1, PA and PB, thereby regulating the output voltage Vo to be less than or equal to the maximum output voltage. In the first phase Ph1, the phase signal P2 is maintained at the low voltage VL; and in the second phase Ph2, the phase signal P1 is maintained at the low voltage VL. The switch signal S1 may be identical to the phase signal P1, the switch signal S2 may be identical to the phase signal P2, the switch signal S3 may be the result of an OR operation of the phase signals P1, PA and PB, and the switch signal S4 may be the result of an OR operation of the phase signals P2, PA and PB. The generation method of the phase signals P1, P2, PA and PB will be explained in the following paragraphs.

At Time t1, the inductor current IL reaches 0 A, setting the phase signal PB to switch from the high voltage VH to the low voltage VL and the phase signal P1 to switch from the low voltage VL to the high voltage VH, while the phase signals PA and P2 are maintained at the low voltage VL, resulting in the switch signal S1 being switched from the low voltage VL to the high voltage VH, the switch signal S2 being maintained at the low voltage VL, the switch signal S3 being maintained at the high voltage VH, and the switch signal S4 being switched from the high voltage VH to the low voltage VL, and thus, the switch 40 is turned off when the inductor current IL reaches 0 A, achieving ZVS while reducing the switching loss.

Between Time t1 and Time t2, the switch signals S1 and S3 are maintained at the high voltage VH, and the switch signals S2 and S4 are maintained at the low voltage VL. Thus, the switches 10 and 30 are turned on and the switches 20 and 40 are turned off, the first terminal of the flying capacitor 50 receives the input voltage Vin via the switch 10, and the second terminal of the flying capacitor 50 is coupled to the first terminal of the inductor 60 via the switch 30. Therefore, the input voltage Vin charges the flying capacitor 50 and the output capacitor 70 and magnetizes the inductor L, while the flying capacitor 50 and the inductor 60 form a resonant circuit to enable the inductor current IL to rise.

At Time t2, the input voltage Vin exceeds the input threshold voltage, setting the phase signal P1 to switch from the high voltage VH to the low voltage VL and the phase signal PA to switch from the low voltage VL to the high voltage VH, while the phase signals P2 and PB are maintained at the low voltage VL, resulting in the switch signal S1 being switched from the high voltage VH to the low voltage VL, the switch signal S2 being maintained at the low voltage VL, the switch signal S3 being maintained at the high voltage VH, and the switch signal S4 being switched from the low voltage VL to the high voltage VH, and thus, the control circuit 800 turns off the switch 10 before the inductor current IL of the inductor 60 reaches 0 A when the inductor 60 is magnetized, thereby reducing the ON time of the switch 10.

Between Time t2 and Time t3, the switch signals S1 and S2 are maintained at the low voltage VL, and the switch signals S3 and S4 are maintained at the high voltage VH, turning off the switches 10 and 20 and turning on the switches 30 and 40. Consequently, and the first terminal of the inductor 60 is coupled to the ground terminal via the switches 30 and 40 to demagnetize the inductor 60, pulling down the inductor current IL to 0 A prior to reaching a peak value. Since the inductor 60 is coupled to the ground terminal, the decreasing speed of the inductor current IL in FIG. 4 is much larger than the decreasing speed of the inductor current IL owing to the resonance in FIG. 3, and the time (=t3−t1) for magnetizing and demagnetizing the inductor 60 once in FIG. 4 is less than the time (=t3−t1) for magnetizing and demagnetizing the inductor 60 once in FIG. 3, and thus, the control circuit 800 switches the switches 10, 20, 30 and 40 according to the regulated frequency exceeding the resonant frequency. The period between time t1 and t3 is referred to as the first phase Ph1.

At Time t3, the inductor current IL reaches 0 A, setting the phase signal PA to switch from the high voltage VH to the low voltage VL and the phase signal P2 to switch from the low voltage VL to the high voltage VH, while the phase signals PB and P1 are maintained at the low voltage VL, resulting in the switch signal S1 being maintained at the low voltage VL, the switch signal S2 being switched from the low voltage VL to the high voltage VH, the switch signal S3 being switched from the high voltage VH to the low voltage VL, and the switch signal S4 being maintained at the high voltage VH, and thus, the switch 30 is turned off when the inductor current IL reaches 0 A, achieving ZVS and reducing the switching loss.

Between Time t3 and Time t4, the switch signals S2 and S4 are maintained at the high voltage VH, and the switch signals S1 and S3 are maintained at the low voltage VL, and thus, the switches 20 and 40 are turned on and the switches 10 and 30 are turned off, the first terminal of the flying capacitor 50 is coupled to the first terminal of the inductor 60 via the switch 20, and the second terminal of the flying capacitor 50 receives the input voltage Vin via the switch 40. The flying capacitor 50 may serve as a voltage source to charge the output capacitor 70 and magnetize the inductor L, and the flying capacitor 50 and the inductor 60 may form a resonant circuit to enable the inductor current IL starting to rise.

At Time t4, the input voltage Vin exceeds the input threshold voltage, setting the phase signal P2 to switch from the high voltage VH to the low voltage VL and the phase signal PB to switch from the low voltage VL to the high voltage VH, while maintaining the phase signals P1 and PA at the low voltage VL, resulting in the switch signal S1 being maintained at the low voltage VL, the switch signal S2 being switch from the high voltage VH to the low voltage VL, the switch signal S3 being switched from the low voltage VL to the high voltage VH, and the switch signal S4 being maintained at the high voltage VH, and thus, the control circuit 800 turns off the switch 20 before the inductor current IL of the inductor 60 reaches 0 A when the inductor 60 is magnetized, thereby reducing the ON time of the switch 20 and switching the switch 20 at the regulated frequency exceeding the resonant frequency.

Between Time t4 and Time t5, the switch signals S1 and S2 are maintained at the low voltage VL, and the switch signals S3 and S4 are maintained at the high voltage VH, turning off the switches 10 and 20 and turning on the switches 30 and 40. Consequently, and the first terminal of the inductor 60 is coupled to the ground terminal via the switches 30 and 40 to demagnetize the inductor 60, pulling down the inductor current IL to 0 A prior to reaching a peak value. The period between time t3 and t5 is referred to as the second phase Ph2. Since the inductor 60 is coupled to the ground terminal, the decreasing speed of the inductor current IL in FIG. 4 is much larger than the decreasing speed of the inductor current IL owing to the resonance in FIG. 3, and the time (=t5−t3) for magnetizing and demagnetizing the inductor 60 once in FIG. 4 is less than the time (=t5−t3) for magnetizing and demagnetizing the inductor 60 once in FIG. 3, and thus, the control circuit 800 switches the switches 10, 20, 30 and 40 according to the regulated frequency exceeding the resonant frequency.

Later, if the control circuit 800 continues to determine that the power converter 1 may be operated in the two-phase operation, the power converter 1 will continue to be operated in the first phase Ph1 and the second phase Ph2 in turn. The operation of the power converter 1 from Time t5 to Time t9 is similar to that from Time t1 to Time t5, and the explanation thereof may be found in the preceding paragraphs, and will not be repeated here.

In comparison to FIG. 2, the control circuit 800 in FIG. 3 may reduce an ON time of the switch 10 or the switch 20, and increase an overlapping ON time of the switch 30 and the switch 40, so as to switch the switches 10, 20, 30 and 40 according to a regulated frequency exceeding the resonant frequency, thereby adjusting the output voltage Vo to equal to or less than the output voltage threshold. In some embodiments, when the output voltage VO exceeds the output voltage threshold, the control circuit 800 may turn off the switch 10 or the switch 20 before the inductor current IL of the inductor 60 reaches 0 when magnetizing the inductor 60. Then, after turning off the switch 10 or the switch 20, the control circuit 800 may turn on the switch 30 and the switch 40 to demagnetize the inductor 60, and when the inductor 60 is demagnetized, the control circuit 800 may turn off the switch 30 or the switch 40 when the inductor current IL of the inductor 60 reaches 0 A. In some embodiments, when the power converter 1 is in a light load condition, the control circuit 800 may further increase the OFF time of the switches 10, 20, 30 and 40.

In some embodiments, when the power converter 1 is in a light load condition, the control circuit 800 may increase the dead-time delays between pulses of the phase signals P1 and PA, PA and P2, P2 and PB, and PB and P1, thereby increasing the OFF times of the switches 10, 20, 30 and 40, and achieving power saving. When there are dead-time delays between the pulses of the phase signal P1 and PA, PA and P2, P2 and PB, PB and P1, each pulse of the switch signals S3 and S4 in FIG. 4 may be replaced by three sub-pulses. For example, the start time of the first sub-pulse of the switch signal S3 may be later than the start time of the original pulse of the switch signal S3 in FIG. 4, and the end time of the third sub-pulse of the switch signal S3 may be later than the end time of the original pulse of the switch signal S3 in FIG. 4, the pulse width of each sub-pulse is less than the pulse width of each original pulse in the switch signal S3 in FIG. 4, and there may be a time interval between two adjacent sub-pulses. Similarly, the start time of the first sub-pulse of the switch signal S4 may be later than the start time of the original pulse of the switch signal S4 in FIG. 4, and the end time of the third sub-pulse of the switch signal S4 may be later than the end time of the original pulse of the switch signal S4 in FIG. 4, the pulse width of each sub-pulse is less than the pulse width of each original pulse in the switch signal S4 in FIG. 4, and there may be a time interval between two adjacent sub-pulses.

FIG. 5 shows waveforms of the power converter 1 in the single-phase operation, wherein the horizontal axis represents time and the vertical axis represents voltage or current. FIG. 6A, FIG. 6B, FIG. 6C, and FIG. 6D are schematic diagrams of the current flows of the power converter 1 during periods T1 to T4 in the single-phase operation. The single-phase operation of the power converter 1 is explained below with reference to FIG. 5, FIG. 6A, FIG. 6B, FIG. 6C, and FIG. 6D. The control circuit 800 may generate switch signals S1 and S2 according to the phase signal P1, and generate switch signals S3 and S4 according to the phase signal PA, so as to adjust the output voltage Vo to be less than or equal to the input voltage Vin. The control circuit 800 may switch the switches 10, 20, 30 and/or 40 when the inductor current IL flows from the second terminal of the inductor 60 to the first second of the inductor 60. The switch signals S1 and S2 may be identical to the phase signal P1, and the switch signals S3 and S4 may be identical to the phase signal PA. The generation of the phase signals P1 and PA will be explained in detail in the following paragraphs.

Figure 6A:
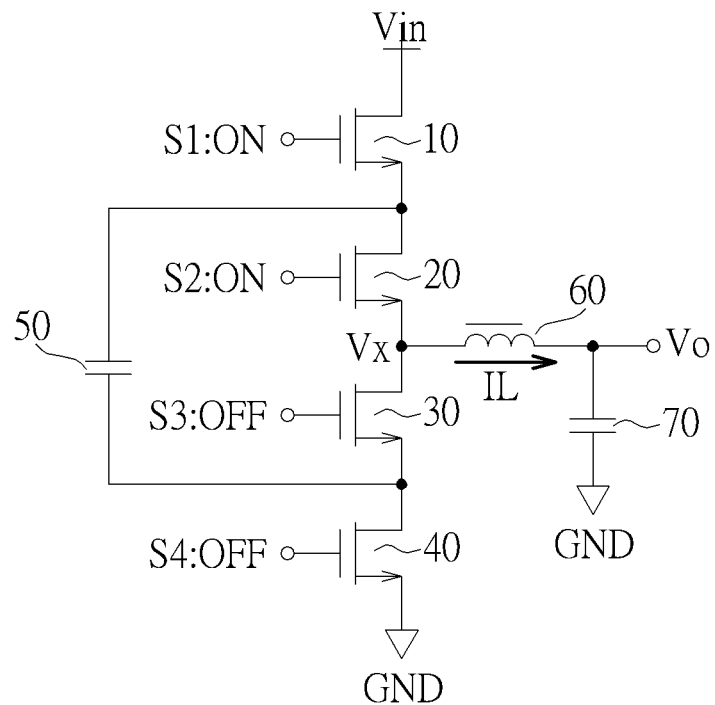
FIG. 6A, FIG. 6B, FIG. 6C, and FIG. 6D show schematic diagrams of current flows of the power converter in FIG. 1 in four periods in the single-phase operation.

At Time t1, the inductor current IL is between a minimum current Imin and 0 A, and the switching voltage Vx is equal to the input voltage Vin, the phase signal P1 is switched from the low voltage VL to the high voltage VH, and the phase signal PA is maintained at the low voltage VL. The minimum current Imin is a negative value close to 0 A, e.g., Imin=−0.1 A. Therefore, the switch signals S1 and S2 are switched from the low voltage VL to the high voltage VH, and the switch signals S3 and S4 are maintained at the low voltage VL, thereby turning on the switches 10 and 20 and turning off the switches 30 and 40. Since the inductor current IL is between the minimum current Imin and 0 A and the switching voltage Vx is equal to the input voltage Vin, the switches 10 and 20 may achieve ZCS and zero-voltage switching (ZVS), reducing the switching loss. Between Time t1 and Time t2, the switch signals S1 and S2 are maintained at the high voltage VH, the switch signals S3 and S4 are maintained at the low voltage VL, the switching voltage Vx is maintained at input voltage Vin, and the inductor current IL continues to rise as shown in FIG. 6A. A time interval between Time t1 and Time t2 is referred to as the period T1. Referring to FIG. 6A, in the period T1, the switching voltage Vx is equal to the input voltage Vin, and the inductor current IL flows sequentially through the switch 10, the switch 20 and the inductor 60 from the first terminal of the switch 10 to charge the output capacitor 70.

Figure 6B:
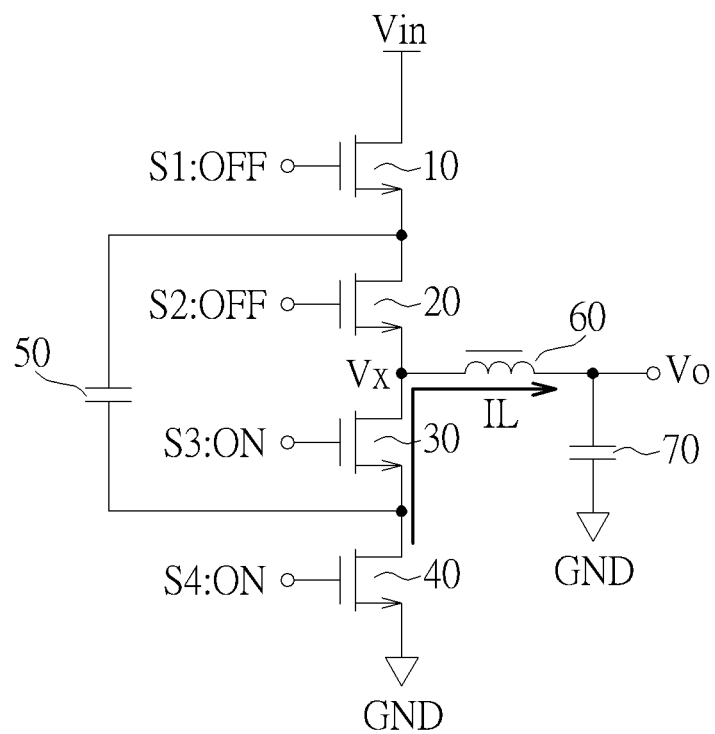

At Time t2, the output voltage Vo reaches the output voltage predetermined value, the phase signal P1 switches from the high voltage VH to the low voltage VL, and the phase signal PA switches from the low voltage VL to the high voltage VH, the inductor current IL reaches a maximum current Imax, and the switching voltage Vx switches to a negative voltage V−. The maximum current Imax is a positive value significantly exceeding 0 A, e.g., Imax=3 A. The negative voltage V− is a negative voltage close to 0V, for example, V−=−10 mV. Therefore, the switch signals S1 and S2 are switched from the high voltage VH to the low voltage VL, and the switch signals S3 and S4 are switched from the low voltage VL to the high voltage VH, thereby turning off the switches 10 and 20 and turning on the switches 30 and 40. Between Time t2 and Time t3, the switch signals S1 and S2 are maintained at the low voltage VL, the switch signals S3 and S4 are maintained at the high voltage VH, the switching voltage Vx is maintained at the negative voltage V−, and the inductor current IL decreases from the maximum current Imax. A time interval between Time t2 and Time t3 may be referred to as the period T2. Referring to FIG. 6B, in the period T2, the switching voltage Vx is the negative voltage V−, the inductor current IL flows through the switch 40, the switch 30 and the inductor 60 from the ground terminal to demagnetize the inductor 60, and the switching voltage Vx is maintained at the negative voltage V−.

Figure 6C:
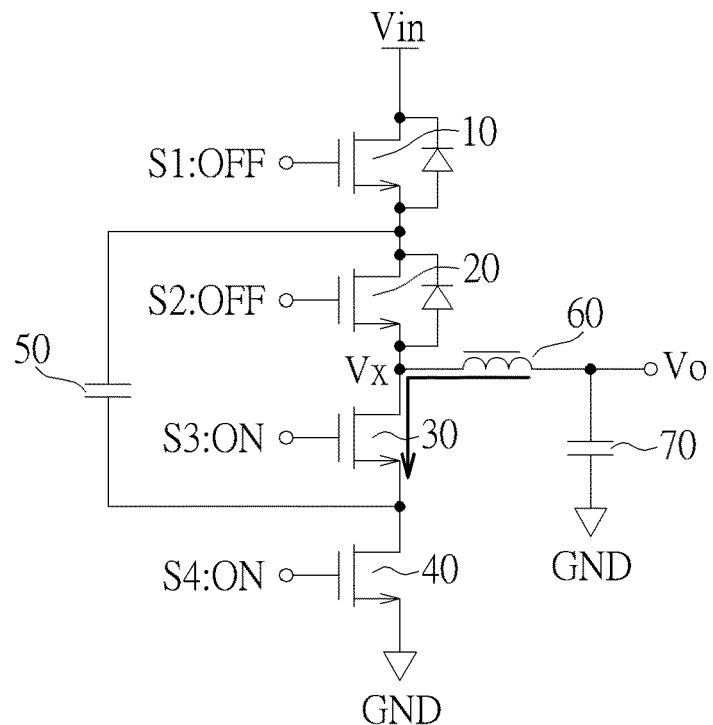

At Time t3, the inductor current IL reaches 0 A, the switching voltage Vx switches to 0V, the phase signal P1 is maintained at the low voltage VL, and the phase signal PA is maintained at the high voltage VH. Therefore, the switch signals S1 and S2 are maintained at the low voltage VL, and the switch signals S3 and S4 are maintained at the high voltage VH. Between Time t3 and Time t4, the switch signals S1 and S2 are maintained at the low voltage VL, and the switch signals S3 and S4 are maintained at the high voltage VH, turning off the switches 10 and 20 and turning on the switches 30 and 40, thereby decreasing the inductor current IL from 0 A, and maintaining the switching voltage Vx at 0V as shown in FIG. 6C. A time interval between Time t3 and Time t4 is referred to as the period T3. Referring to FIG. 6C, in the period T3, the switching voltage V is 0V, the inductor 60 is fully demagnetized, and the inductor current IL sequentially flows through the inductor 60, the switch 30, and the switch 40 to reduce the inductor current IL to a negative value. The length of the period T3 may be positively correlated with the magnitude of the inductor current IL. The longer the period T3 is, the larger the inductor current IL will be.

Figure 6D:
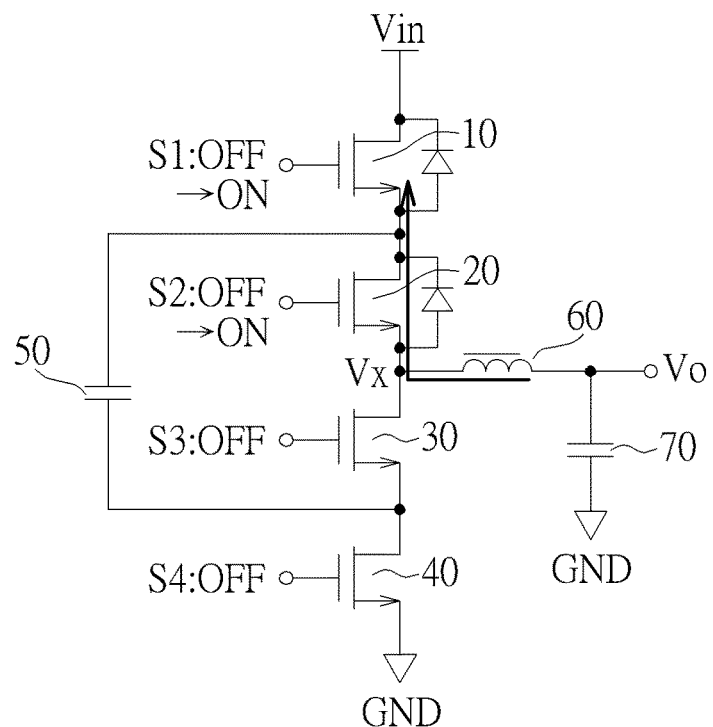

At Time t4, the phase signal P1 is maintained at the low voltage VL, the phase signal PA is switched from the high voltage VH to the low voltage VL, the inductor current IL reaches the minimum current Imin, and the switching voltage Vx is switched to the input voltage Vin. Therefore, the switch signals S1 and S2 are maintained at the low voltage VL, and the switch signals S3 and S4 are switched from the high voltage VH to the low voltage VL, turning off the switches 10 and 20 and turning off the switches 30 and 40. Between Time t4 and Time t5, the switch signals S1 and S2 are maintained at the low voltage VL, the switch signals S3 and S4 are maintained at the low voltage VL, the inductor current IL rises from the minimum current Imin, and the switching voltage Vx is maintained at the input voltage Vin. A time interval between Time t4 and Time t5 may be referred to as the period T4. Referring to FIG. 6D, in the period T4, the switching voltage Vx is equal to the input voltage Vin, and since the switches 30 and 40 are turned off, the inductor current IL sequentially flows through the inductor 60, the body diode of the switch 20, and the body diode of the switch 10 to the first terminal of switch 10. The time interval between Time t1 and Time t4 is referred to as the first phase Ph1.

Later, if the control circuit 800 continues to determine that the power converter 1 may be operated in the single-phase operation, the power converter 1 will continue to be operated in the first phase Ph1 repeatedly.

In the embodiment in FIG. 4, the control circuit 800 turns off the switches 30 and 40 after the inductor current IL reaches 0 A, so as to realize ZCS and ZVS simultaneously. In other embodiments, the control circuit 800 may also turn off the switches 30 and 40 when the inductor current IL reaches 0 in a single-phase operation, so as to achieve ZCS. In some other embodiments, the control circuit 800 may also turn off the switches 10, 20, 30 and 40 before the inductor current IL reaches 0 during single-phase operation, so as to increase the average inductor current IL and reduce the period of the first stage Ph1, increasing the regulated frequency and increasing the circuit efficiency.

Although the embodiments in FIG. 2 and FIG. 3 only illustrate turning off the switches 10, 20, 30 and/or 40 when the inductor current IL reaches 0 in the non-regulated mode and the second-stage operation, those skilled in the art would recognize that the control circuit 800 may turn off the switches 10, 20, 30 and/or 40 after the inductor current IL reaches 0 A based on the principle of generating the negative inductor current IL in the embodiment of FIG. 4, so as to achieve simultaneous ZCS and ZVS in the non-regulated mode and the two-phase operation, reducing the switching loss. In some embodiments, the control circuit 800 may turn off the switches 10, 20, 30 and/or 40 before the inductor current IL reaches 0 in the non-regulated mode and/or the two-phase operation, so as to increase the average inductor current IL, reduce the period of the first stage Ph1, increase the regulated frequency, and increase the circuit efficiency.

Further, the control circuit 800 may reduce an ON time of the switch 10 or the switch 20, and increase an overlapping ON time of the switch 30 and the switch 40, so as to switch the switches 10, 20, 30 and 40 according to the regulated frequency exceeding the resonant frequency, thereby adjusting the output voltage Vo to equal to or less than the output voltage threshold. In some embodiments, when the output voltage VO exceeds the maximum output voltage, the control circuit 800 may turn off the switch 10 or the switch 20 before the inductor current IL of the inductor 60 reaches 0 when magnetizing the inductor 60. Then, after turning off the switch 10 or the switch 20, the control circuit 800 may turn on the switch 30 and the switch 40 to demagnetize the inductor 60, and when the inductor 60 is demagnetized, the control circuit 800 may turn off the switch 30 or the switch 40 when the inductor current IL of the inductor 60 reaches 0 A. In some embodiments, when the power converter 1 is in a light load condition, the control circuit 800 may further increase the OFF time of the switches 10, 20, 30 and 40.

Figure 7:
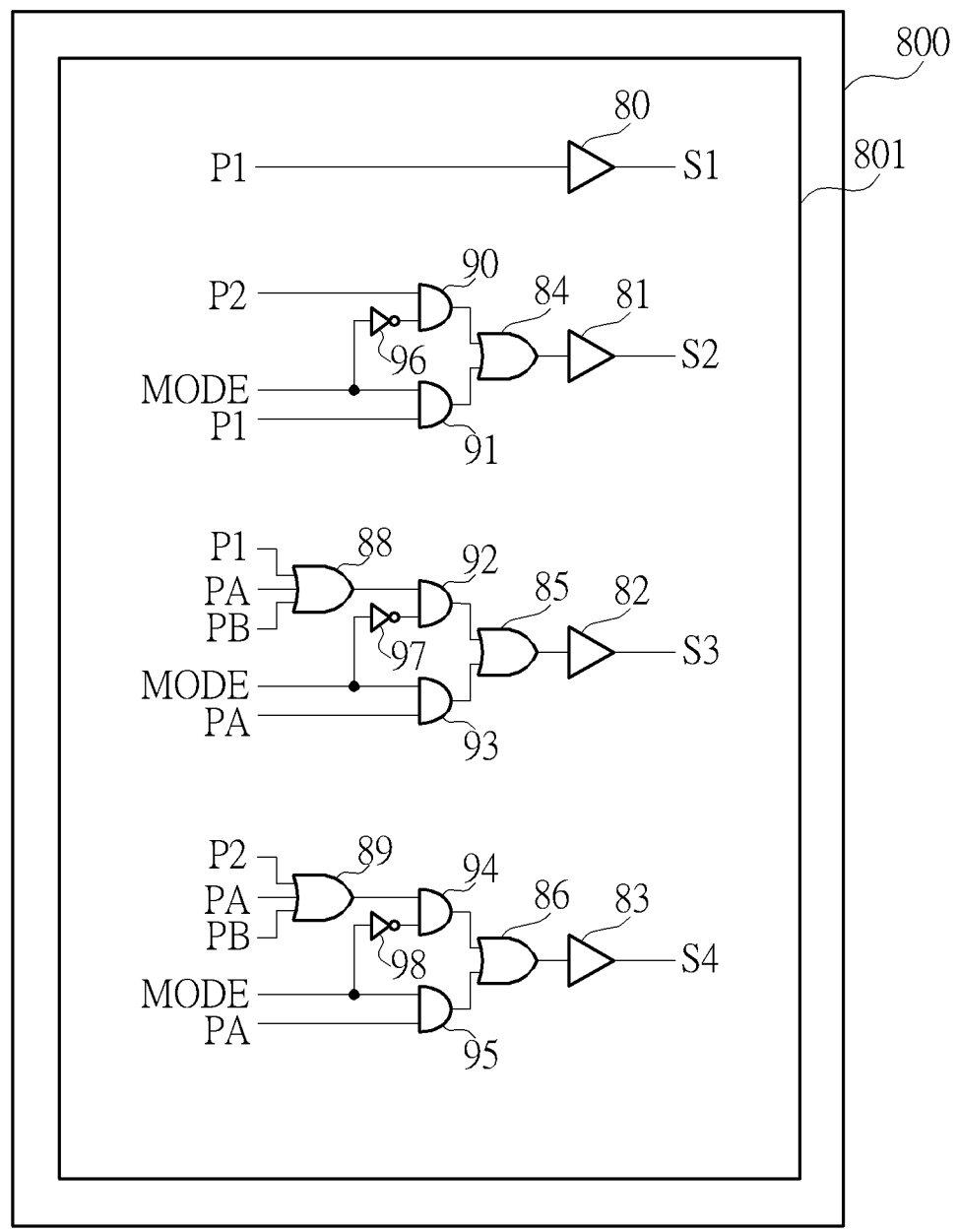
FIG. 7 is a circuit schematic of a signal generation circuit of the control circuit in FIG. 1.

FIG. 7 is a circuit schematic of a portion of the control circuit 800. The control circuit 800 may include a signal generation circuit 801. The signal generation circuit 801 may generate the switch signals S1 to S4 according to the phase signals P1, P2, PA and PB. The signal generation circuit 801 may include buffers 80 to 83, OR gates 84, 85, 86 and 88, and AND gates 90 to 95, and inverters 96 to 98. The mode signal MODE may be enabled during the single-phase operation, and may be disabled during non-regulated mode and two-phase operation. The mode signal MODE may be used to disable the switch signals S2 and S4.

The buffer 80 includes an input terminal configured to receive the phase signal P1, and an output terminal configured to output the switch signal S1. The phase signal P1 may pass through the buffer 80 to generate the switch signal S1, and thus the switch signal S1 may be the phase signal P1 after a gate delay.

The inverter 96 includes an input terminal configured to receive the mode signal MODE, and an output terminal. The AND gate 90 includes a first input terminal configured to receive the phase signal P2, a second input terminal coupled to the output terminal of the inverter 96, and an output terminal. The AND gate 91 includes a first input terminal configured to receive the mode signal MODE, a second input terminal configured to receive the phase signal P1, and an output terminal. The OR gate 84 includes a first input terminal coupled to the output terminal of the AND gate 90, a second input terminal coupled to the output terminal of the AND gate 91, and an output terminal. The buffer 81 includes an input terminal coupled to the output terminal of the OR gate 84, and an output terminal configured to output the switch signal S4. When the mode signal MODE is enabled, the switch signal S2 may be the phase signal P1 after a gate delay. When the mode signal MODE is disabled, the switch signal S2 may be the phase signal P2 after a gate delay.

The OR gate 88 includes a first input terminal configured to receive the phase signal P1, a second input terminal configured to receive the phase signal PA, a third input terminal configured to receive the phase signal PB, and an output terminal. The inverter 97 includes an input terminal configured to receive the mode signal MODE, and an output terminal. The AND gate 92 includes a first input terminal coupled to the output terminal of the OR gate 88, a second input terminal coupled to the output terminal of the inverter 97, and an output terminal. The AND gate 93 includes a first input terminal configured to receive the mode signal MODE, a second input terminal configured to receive the phase signal PA, and an output terminal. The OR gate 85 includes a first input terminal coupled to the output terminal of the AND gate 92, a second input terminal coupled to the output terminal of the AND gate 93, and an output terminal. The buffer 82 includes an input terminal coupled to the output terminal of the OR gate 85, and an output terminal configured to output the switch signal S3. When the mode signal MODE is enabled, the switch signal S3 may be the phase signal PA after a gate delay. When the mode signal MODE is disabled, the switch signal S3 may be the result of an OR operation of the phase signals PA1, PA and PB after a gate delay.

The OR gate 89 includes a first input terminal configured to receive the phase signal P1, a second input terminal configured to receive the phase signal PA, a third input terminal configured to receive the phase signal PB, and an output terminal configured to output the result of an OR operation of the phase signals P1, PA and PB. The inverter 98 includes an input terminal configured to receive the mode signal MODE, and an output terminal. The AND gate 94 includes a first input terminal coupled to the output terminal of the OR gate 89, a second input terminal coupled to the output terminal of the inverter 98, and an output terminal. The AND gate 95 includes a first input terminal configured to receive the mode signal MODE, a second input terminal configured to receive the phase signal PA, and an output terminal. The OR gate 86 includes a first input terminal coupled to the output terminal of the AND gate 94, a second input terminal coupled to the output terminal of the AND gate 95, and an output terminal. The buffer 83 includes an input terminal coupled to the output terminal of the OR gate 86, and an output terminal configured to output the switch signal S4. The switch signal S4 may be the phase signal PA after a delay. When the mode signal MODE is disabled, the switch signal S4 may be the result of an OR operation of the phase signals PA2, PA and PB after a gate delay.

Figure 8:
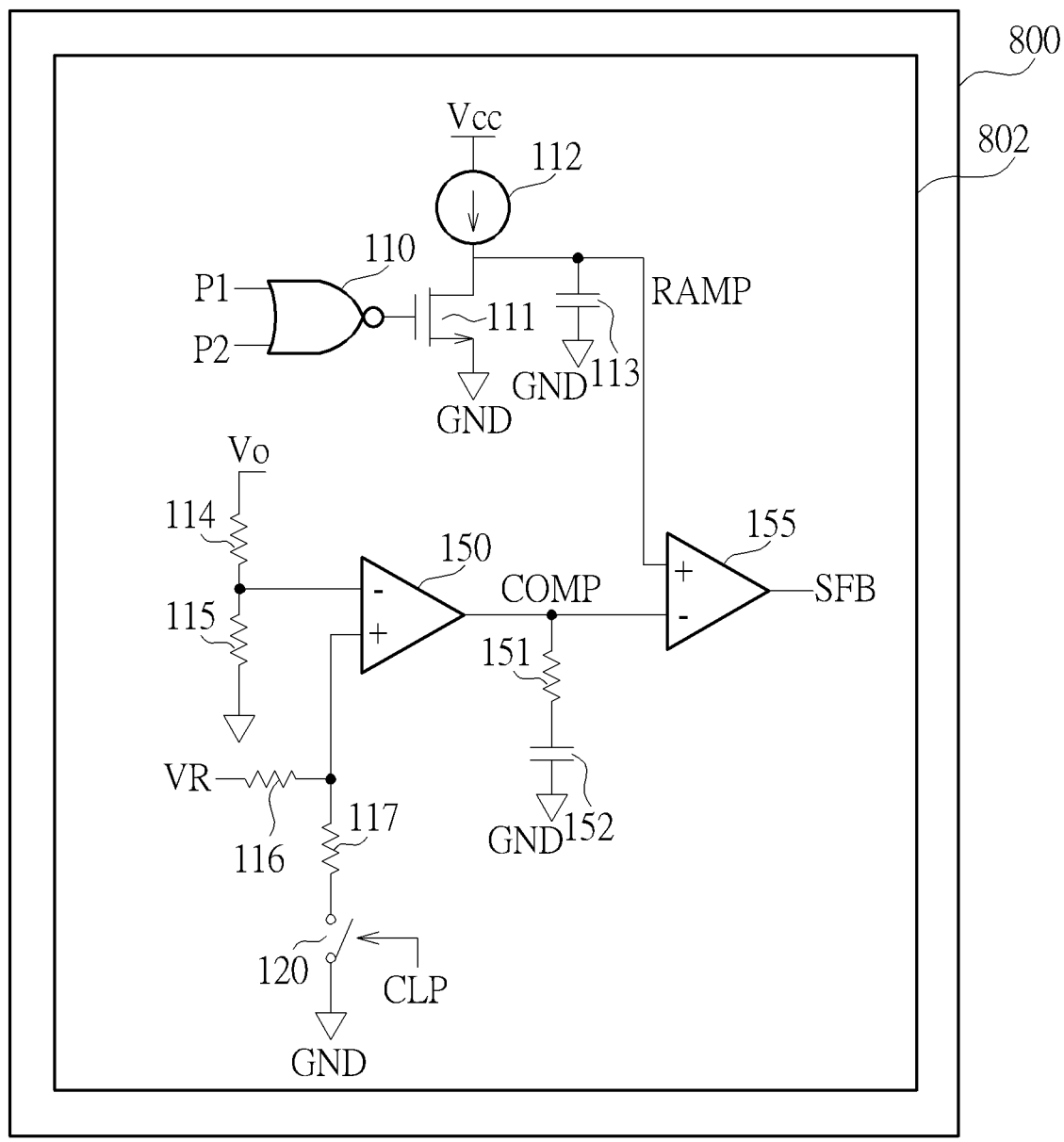
FIG. 8 is a circuit schematic of a feedback circuit of the control circuit in FIG. 1.

FIG. 8 is a schematic diagram of another portion of the control circuit 800. The control circuit 800 may further include a feedback circuit 802. The feedback circuit 802 may generate a feedback signal SFB to adjust the output voltage Vo. The feedback signal SFB may indicate that the input voltage Vin exceeds the input voltage threshold and/or the output voltage Vo exceeds the maximum output voltage, and may be used to perform an early reset on the phase signals P1 and/or P2 for setting the same to the low voltage VL, thereby reducing the ON times of the switches 10 and/or 20 and increasing the regulated frequency. The feedback circuit 802 may include a NOR gate 110, a current source 112, a transistor 111, capacitors 113 and 152, resistors 114, 115, 116, 117 and 151, a switch 120, an error amplifier 150 and a comparator 155.

The NOR gate 110 includes a first input terminal configured to receive the phase signal P1, a second input terminal configured to receive the phase signal P2, and an output terminal configured to output the result of an OR operation of the phase signals P1 and P2. The current source 112 includes a first terminal coupled to a supply terminal configured to receive a supply voltage Vcc, and a second terminal. The transistor 111 includes a control terminal coupled to the output terminal of the NOR gate 110 and configured to receive the operation result of the NOR gate 110, a first terminal coupled to the second terminal of the current source 112, and a second terminal coupled to a ground terminal. The output capacitor 113 includes a first terminal coupled to the first terminal of the transistor 111, and a second terminal coupled to the ground terminal. The NOR gate 110, the current source 112, the transistor 111 and the capacitor 113 may form a ramp circuit. When the phase signal P1 or the phase signal P2 is at the high voltage VH, the ramp circuit may generate a gradually rising ramp signal RAMP. When the phase signal P1 and/or the phase signal P2 are both at the low voltage VL, the ramp circuit may reset the ramp signal RAMP to the ground voltage GND.

The resistor 114 includes a first terminal configured to receive the output voltage Vo, and a second terminal. The resistor 115 includes a first terminal coupled to the second terminal of the resistor 114, and a second terminal coupled to the ground terminal. The resistor 116 includes a first terminal configured to receive the reference voltage VR, and a second terminal. The reference voltage VR may be set to 2V or other suitable values. In some embodiments, the power converter 1 may use the same reference voltage VR, such as 2V, for the single-phase operation and the two-phase operation. In some embodiments, the power converter 1 may use different reference voltage VR for the single-phase operation and the two-phase operation. For example, the reference voltage VR for the single-phase operation may be 1.6V, and the reference voltage VR for the two-phase operation may be 2V. The resistor 117 includes a first terminal coupled to the second terminal of the resistor 116, and a second terminal. The switch 120 includes a control terminal configured to receive a closed-loop signal CLP, a first terminal coupled to the second terminal of the resistor 116, and a second terminal coupled to the ground terminal. The resistors 114 and 115 may form a voltage divider for generating a divided voltage according to the output voltage Vo. For example, the resistance of the resistor 114 may be 9 k ohms, and the resistance of the resistor 115 may be 1 k ohms, and the voltage divider may have a voltage division ratio of 10:1. If the output voltage Vo is 20V, the first terminal of the resistor 115 may generate 2V as the divided voltage of the output voltage Vo. The error amplifier 150 includes an inverting terminal coupled to the second terminal of the resistor 114, a non-inverting terminal coupled to the second terminal of the resistor 116, and an output terminal. The resistor 151 includes a first terminal coupled to the output terminal of the error amplifier 150, and a second terminal. The capacitor 152 includes a first terminal coupled to the second terminal of the resistor 151, and a second terminal coupled to the ground terminal. When the closed-loop signal CLP is at the low voltage VL, the switch 120 may be turned off, and the error amplifier 150 may compare the divided voltage of the output voltage Vo with the reference voltage VR to generate the error amplification signal COMP. The error amplification signal COMP may be a stable voltage level related to the output voltage Vo. If the divided voltage of the output voltage Vo exceeds the reference voltage VR, the error amplification signal COMP will decrease; if the divided voltage of the output voltage Vo is less than the reference voltage VR, the error amplification signal COMP will increase. For example, if the reference voltage VR is 2V and the divided voltage of the output voltage Vo is 2V, the error amplifier 150 may set the error amplification signal COMP to 3V; if the reference voltage VR is 2V and the divided voltage of the output voltage Vo is 2.2V, then The error amplifier 150 may set the error amplification signal COMP to 2.8V; if the reference voltage VR is 2V and the divided voltage of the output voltage Vo is 1.8V, the error amplifier 150 may set the error amplification signal COMP to 3.2V.

The closed-loop signal CLP may indicate the operation mode of the power converter 1. If the closed-loop signal CLP is at the low voltage VL, the power converter 1 is operated in the non-regulated mode, and if the closed-loop signal CLP is at the high voltage VH, the power converter 1 is operated in the regulated mode. When the closed-loop signal CLP is at the high voltage VH, the switch 120 may be turned on, and the resistors 116 and 117 may form a voltage divider for generating voltage division according to the reference voltage VR. The error amplifier 150 may compare the divided voltage of the output voltage Vo and the divided voltage of the reference voltage VR to generate an amplified error signal COMP. For example, the resistance of the resistor 116 may be 1 k ohms, and the resistance of the resistor 117 may be 9 k ohms, enabling the voltage divider to provide a voltage division ratio of 10:9. If the reference voltage VR is 2V, the first terminal of the resistor 177 may output 1.8V as the divided voltage of the reference voltage VR. The error amplifier 150 may reduce the level of the error amplification signal COMP when the divided voltage of the output voltage Vo exceeds 1.8V, and increase the level of the error amplification signal COMP when the divided voltage of the output voltage Vo is less than 1.8V. The closed-loop signal CLP may provide hysteresis control on the reference voltage VR. The resistor 151 and the capacitor 152 may form a low-pass filter to filter the error amplification signal COMP. In some embodiments, the resistor 151 and the capacitor 152 may also be omitted and the error amplification signal COMP is directly input to the comparator 155.

The comparator 155 includes a non-inverting terminal coupled to the first terminal of the capacitor 113, an inverting terminal coupled to the first terminal of the resistor 151, and an output terminal configured to output a feedback signal SFB. The comparator 155 may compare the ramp signal RAMP and the error amplification signal COMP. When the ramp signal RAMP is less than the error amplifier signal COMP, the comparator 155 may set the feedback signal SFB to the low voltage VL, and once the ramp signal RAMP reaches the error amplifier signal COMP, the comparator 155 may insert a positive pulse having a predetermined width into the feedback signal SFB.

According to the preceding paragraphs, if the divided voltage of the output voltage Vo exceeds the reference voltage VR, the error amplification signal COMP will decrease, enabling the ramp signal RAMP to reach the error amplification signal COMP in less time, thereby speeding up the generation of the feedback signal SFB. Further, when the closed-loop signal CLP is at the high voltage VH, the error amplification signal COMP may be further reduced, enabling the ramp signal RAMP to reach the error amplification signal COMP in even less tie, thereby generating the feedback signal SFB in a faster and more stable manner, increasing the reliability of the feedback signal SFB.

Figure 9:
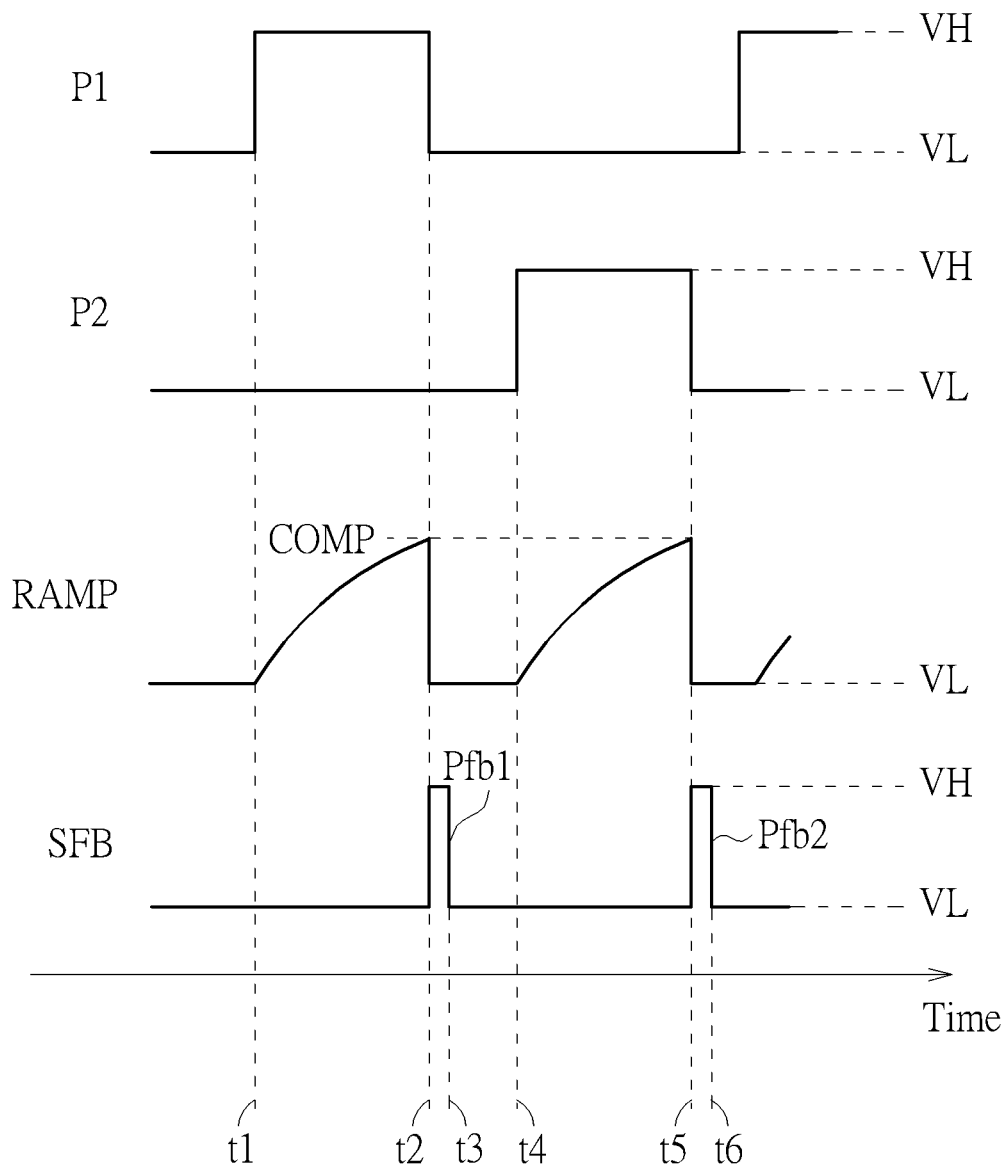
FIG. 9 shows waveforms of the feedback circuit in FIG. 8.

FIG. 9 is a waveform diagram of the feedback circuit 802, where the horizontal axis represents time and the vertical axis represents voltage. The operation method of the RC circuit 802 will be explained with reference to FIG. 8.

Between Time t1 and Time t2, the phase signal P1 is at the high voltage VH, the ramp signal RAMP starts to rise, and the phase signal P2 and the feedback signal SFB are maintained at the low voltage VL simultaneously. At Time t2, the ramp signal RAMP is equal to the error amplification signal COMP, triggering the generation of the pulse Pfb1 in the feedback signal SFB. The pulse Pfb1 in turn sets the phase signal P1 to the low voltage VL. Since the phase signals P1 and P2 are both at the low voltage VL, the ramp signal RAMP is reset to the low voltage VL. At Time t6, the pulse Pfb2 ends, and the phase signals P1 and P2 and the ramp signal RAMP are maintained at the low voltage VL. Between Time t3 and Time t4, the phase signals P1 and P2, the ramp signal RAMP and the feedback signal SFB are all maintained at the low voltage VL. In the single-phase operation, if the input voltage Vin is too low, for example, the reference voltage VR is 2V and the input voltage Vin is equal to 10V, the ramp signal RAMP will continue to be less than the error amplification signal COMP, and thus the comparator 155 will not generate any pulse in the feedback signal SFB.

Between Time t1 and Time t2, the phase signal P1 is at the high voltage VH, triggering the ramp signal RAMP to rise, while the phase signal P2 and the feedback signal SFB are maintained at the low voltage VL simultaneously. At Time t5, the ramp signal RAMP is equal to the error amplification signal COMP, starting the generation of the pulse Pfb2 in the feedback signal SFB. The pulse Pfb2 in turn sets the phase signal P2 to the low voltage VL. Since the phase signals P1 and P2 are both at the low voltage VL, the ramp signal RAMP is reset to the low voltage VL. At Time t6, the pulse Pfb2 ends, and the phase signals P1 and P2 and the ramp signal RAMP are maintained at the low voltage VL.

The feedback circuit 802 may repeat the waveform from time t1 to t2 to generate the feedback signal SFB.

Figure 10:
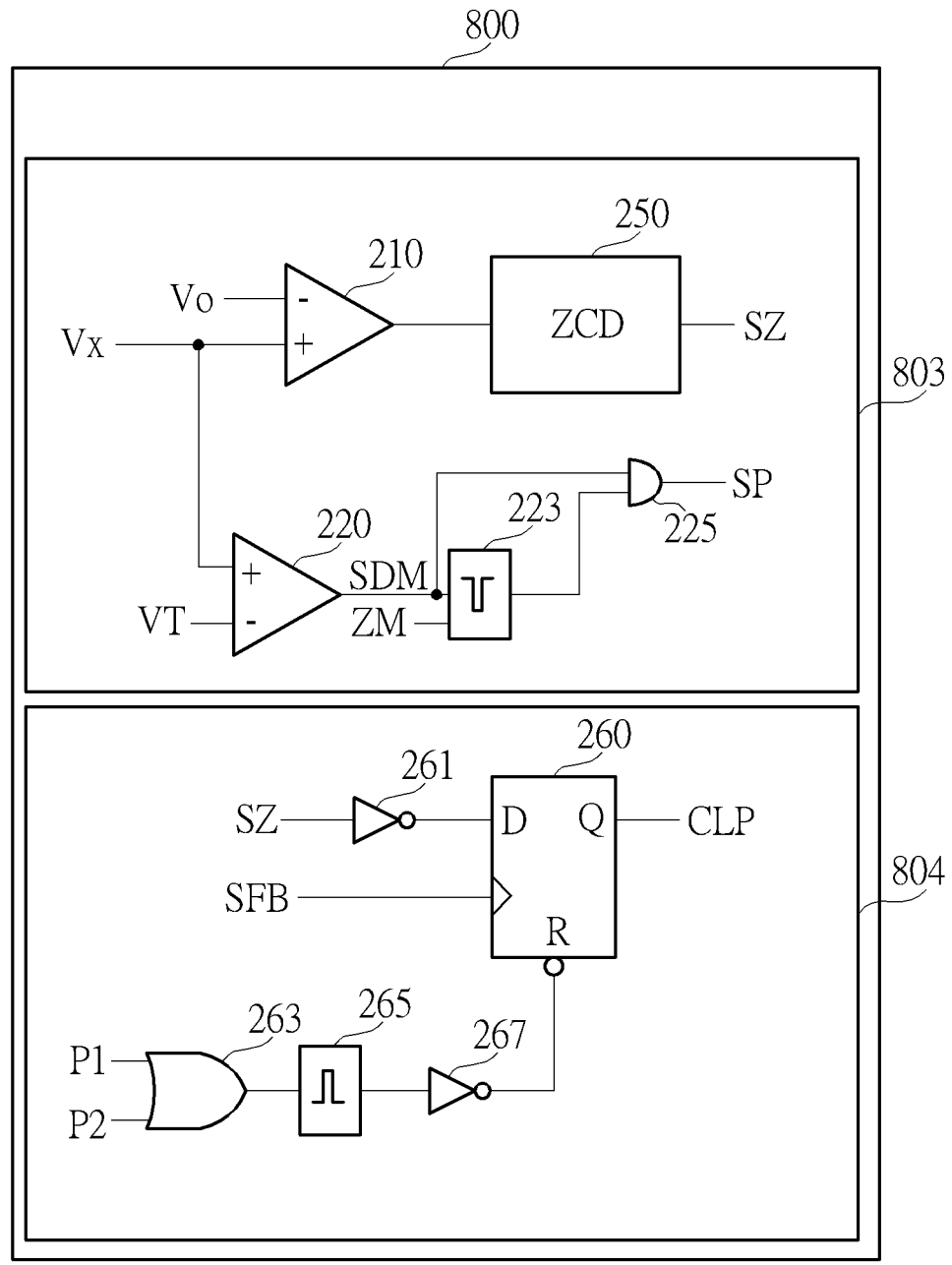
FIG. 10 is a circuit schematic of a state detection circuit and a closed-loop circuit of the control circuit in FIG. 1.

FIG. 10 is a schematic diagram of other portions of the control circuit 800. The control circuit 800 may further include a state detection circuit 803 and a closed loop circuit 804. The state detection circuit 803 may generate the zero-crossing signal SZ and a stop signal SP. The zero-crossing signal SZ may indicate that the voltage across the inductor 60 passes 0V, and the stop signal SP may be used to turn off the switches 30 and 40. The closed-loop circuit 804 may generate the closed-loop signal CLP indicative of the operation mode of the power converter 1. When the closed-loop signal CLP is at a high voltage VH, the power converter 1 may operate in the regulated mode, and when the closed-loop signal CLP is at a low voltage VL, the power converter 1 may operate in the non-regulated mode.

The state detection circuit 803 may include comparators 210 and 220, a zero-crossing detector (ZCD) 250, a pulse generator 223 and an AND gate 225. The comparator 210 includes a non-inverting terminal configured to receive the switching voltage Vx, an inverting terminal configured to receive the output voltage Vo, and an output terminal configured to output a comparison result of the switching voltage Vx and the output voltage Vo. The switching voltage Vx is the voltage at the first terminal of the inductor 60, and the output voltage Vo is the voltage at the second terminal of the inductor 60. When the switching voltage Vx exceeds the output voltage Vo, the comparator 210 may output the high voltage VH as the comparison result. When the switching voltage Vx is less than the output voltage Vo, the comparator 210 may output the low voltage VL as the comparison result. The zero-crossing detector 250 includes an input terminal coupled to the output terminal of the comparator 210, and configured to receive the comparison result of the switching voltage Vx and the output voltage Vo, and an output terminal configured to output the zero-crossing signal SZ. When 2 consecutive comparison results of the comparator 210 vary from the high voltage VH to the low voltage VL or from the low voltage VL to the high voltage VH, the zero-crossing detector 250 may generate a pulse having a predetermined width in the zero-crossing signal SZ. When the 2 consecutive comparison results of the comparator 210 are both the high voltage VH or both the low voltage VH, the zero-crossing detector 250 may set the zero-crossing signal SZ to the low voltage VL.

The comparator 220 includes a non-inverting terminal configured to receive the switching voltage Vx, an inverting terminal configured to receive the demagnetizing reference voltage VT, and an output terminal configured to output a comparison result of the switching voltage Vx and the demagnetizing reference voltage VT as a demagnetizing signal SDM. The demagnetizing reference voltage VT may be set to 0V. The switching voltage Vx may be equal to the voltage across the switches 30 and 40. When the inductor 60 is fully demagnetized, the switching voltage Vx will reach a peak value. When the switching voltage Vx exceeds the demagnetizing reference voltage VT, the comparator 220 may set the demagnetizing signal SDM to the high voltage VH. When the switching voltage Vx is less than the demagnetizing reference voltage VT, the comparator 220 may set the demagnetizing signal SDM to the low voltage VL. The pulse generator 223 includes an enable terminal configured to receive a control signal ZM, an input terminal configured to receive the demagnetizing signal SDM, and an output terminal. The AND gate 225 includes a first input terminal configured to receive the demagnetizing signal SDM, a second input terminal coupled to the output terminal of the pulse generator 223, and an output terminal configured to output the stop signal SP. The control signal ZM may be used to control the ZVS operation of the power converter 1. The control signal ZM may be enabled in the single-phase operation, and disabled in non-regulated mode and the two-phase operation.

When the control signal ZM is disabled, the stop signal SP may be the demagnetizing signal SDM after a gate delay. When the control signal ZM is enabled, the pulse generator 223 may generate a negative pulse in the stop signal SP after a first predetermined delay upon receiving the demagnetizing signal SDM, and the stop signal SP may be the negative pulse after a first predetermined delay. The length of the first predetermined delay is equal to the length of the period T3 in FIG. 5.

The closed loop circuit 804 may include inverters 261 and 267, a flip-flop 260, a pulse generator 265 and an OR gate 263. The inverter 261 includes an input terminal configured to receive the zero-crossing signal SZ, and an output terminal configured to output an inverse of the zero-crossing signal SZ. The OR gate 263 includes a first input terminal configured to receive the phase signal P1, a second input terminal configured to receive the phase signal P2, and an output terminal configured to output the result of an OR operation of the phase signals P1 and P2. The pulse generator 265 includes an input terminal configured to receive the result of the OR operation of the output phase signals P1 and P2, and an output terminal configured to output a first pulse signal. The inverter 267 includes an input terminal configured to receive the first pulse signal, and an output terminal configured to output a first reset signal. The flip-flop 260 includes an input terminal configured to receive the inverse of the zero-crossing signal SZ, a clock terminal configured to receive the feedback signal SFB, a reset terminal configured to receive the first reset signal, and an output terminal configured to output the closed-loop signal CLP. The closed-loop signal CLP may be triggered by the feedback signal SFB and reset by the rising edge of the phase signal P1 or P2.

Figure 11:
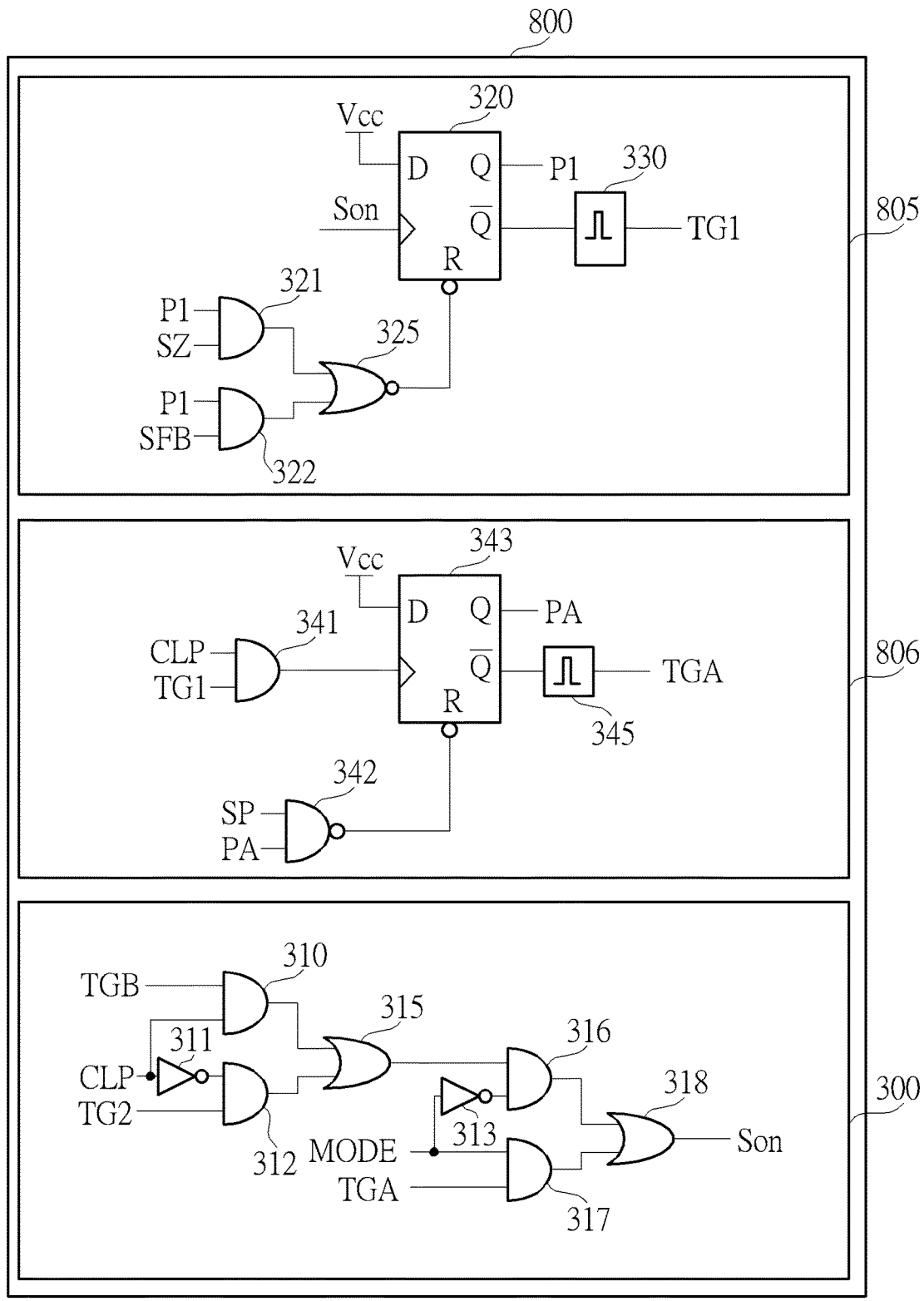
FIG. 11 is a circuit schematic of a start circuit and a phase circuit of the control circuit in FIG. 1.
Figure 12:
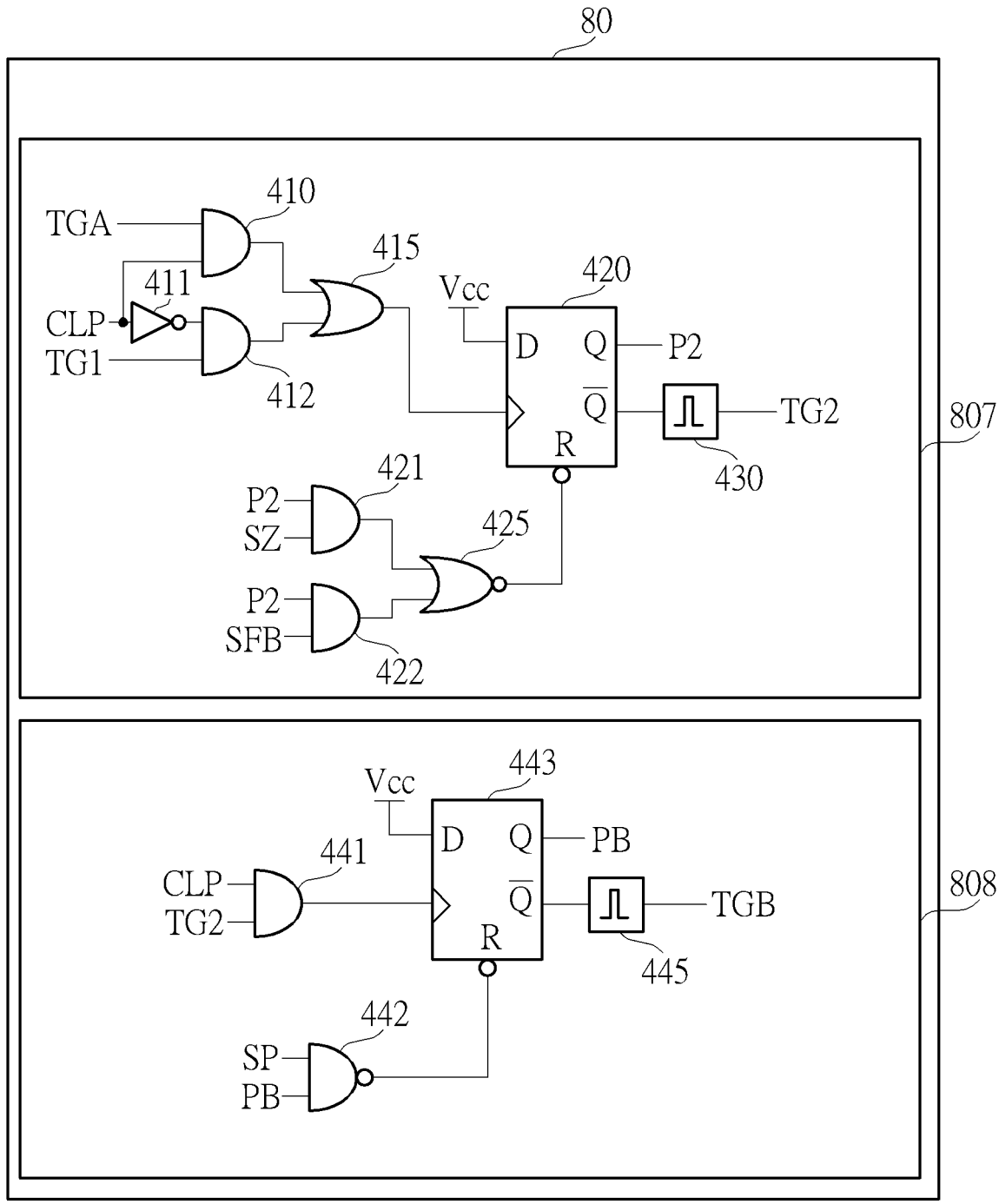
FIG. 12 is a circuit schematic of other phase circuits of the control circuit in FIG. 1.

FIG. 11 and FIG. 12 are schematic diagrams of other parts of the control circuit 800. FIG. 11 shows that the control circuit 800 may further include a start circuit 300, and phase circuits 805 and 806. FIG. 12 shows that the control circuit 800 may further include phase circuits 807 and 808. The start circuit 300 may generate a start signal Son, the phase circuit 805 may generate the phase signal P1 and a trigger signal TG1, the phase circuit 806 may generate the phase signal PA and a trigger signal TGA, the phase circuit 807 may generate the phase signal P2 and a trigger signal TG2, and the phase circuit 808 may generate the phase signal PB and a trigger signal TGB. When the closed loop signal CLP is at the low voltage VL (non-regulated mode), the phase circuits 805 and 807 are enabled and the phase circuits 806 and 808 are disabled. When the closed-loop signal CLP is at the high voltage VH (regulated mode), the phase circuits 805 to 808 are all enabled.

The phase circuit 805 may include AND gate 321 and 322, a NOR gate 325, a flip-flop 320 and a pulse generator 330. The AND gate 321 includes a first input terminal configured to receive the phase signal P1, a second input terminal configured to receive the zero-crossing signal SZ, and an output terminal configured to output the result of an AND operation of the phase signal P1 and the zero-crossing signal SZ. The AND gate 322 includes a first input terminal configured to receive the phase signal P1, a second input terminal configured to receive the feedback signal SFB, and an output terminal configured to output the result of an AND operation of the phase signal P1 and the feedback signal SFB. The NOR gate 325 includes a first input terminal coupled to the output terminal of the AND gate 321 and configured to receive the output of the AND gate 321, a second input terminal coupled to the output terminal of the AND gate 322 and configured to receive the output of the AND gate 322, and an output terminal configured to output the result of an NOR operation. The flip-flop 320 includes an input terminal configured to receive the supply voltage Vcc, a clock terminal configured to receive the start signal Son, a reset terminal coupled to the output terminal of the NOR gate 325 and configured to receive the output of the NOR gate 325, an output terminal configured to output the output phase signal P2, and an inverse output terminal configured to output the inverse of the phase signal P2. The pulse generator 330 includes an input terminal configured to receive the inverse of the phase signal P1, and an output terminal configured to output the trigger signal TG1.

The phase circuit 806 may include an AND gate 341, a NAND gate 342, a flip-flop 343 and a pulse generator 345. The AND gate 341 includes a first input terminal configured to receive the closed-loop signal CLP, a second input terminal configured to receive the trigger signal TG1, and an output terminal configured to output the result of an AND operation of the closed-loop signal CLP and the trigger signal TG1. The NAND gate 342 includes a first input terminal configured to receive the stop signal SP, a second input terminal configured to receive the phase signal PA, and an output terminal configured to output the result of an NAND operation of the stop signal SP and the phase signal PA. The flip-flop 343 includes an input terminal configured to receive the supply voltage Vcc, a clock terminal coupled to the output terminal of the AND gate 341 and configured to receive the output of the AND gate 341, and a reset terminal coupled to the output terminal of the NAND gate 342 and configured to receive the output of the NAND gate 342, an output terminal configured to output the phase signal PA, and an inverse output terminal configured to output the inverse of the phase signal PA. The pulse generator 345 includes an input terminal configured to receive the inverse of the phase signal PA, and an output terminal configured to output the trigger signal TGA.

The flip-flop 320 may be triggered by the start signal Son to set the phase signal P1 to the high voltage VH, and may reset the phase signal P1 by the zero-crossing signal SZ and/or the feedback signal SFB. The pulse generator 330 may generate a dead-time delay for the trigger signal TG1. The longer the dead-time delay of the trigger signal TG1 is, the more the start time of the phase signal P2/PA will be delayed, increasing the dead-time delay between the end time of the phase signal P1 and the start time of the phase signal P2/PA.

When the closed-loop signal CLP is at the low voltage VL, the phase circuit 806 is disabled. When the closed-loop signal CLP is at the high voltage VH, the phase circuit 806 is enabled, the flip-flop 343 may be triggered by the trigger signal TG1 to generate the phase signal PA, and the phase signal PA may be reset by the stop signal SP. The pulse generator 345 may be used to generate the dead-time delay (a second predetermined delay) of the trigger signal TGA. The longer the dead-time delay of the trigger signal TGA is, the more the start time of the phase signal P2 will be delayed, increasing the dead-time delay between the end time of the phase signal PA and the start time of the phase signal P2. The length of the second predetermined delay is equal to the length of the period T4 in FIG. 5.

The initiation circuit 300 may include inverters 311 and 313, AND gates 310, 312, 316 and 317, and OR gates 315 and 318. The inverter 311 includes an input terminal configured to receive the closed-loop signal CLP, and an output terminal configured to output the inverse of the closed-loop signal CLP. The AND gate 310 includes a first input terminal configured to receive the trigger signal TGB, a second input terminal configured to receive the closed-loop signal CLP, and an output terminal. The AND gate 312 includes a first input terminal configured to receive the inverse of the closed-loop signal CLP, a second input terminal configured to receive the trigger signal TG2, and an output terminal. The OR gate 315 includes a first input terminal coupled to the output terminal of the AND gate 310, a second input terminal coupled to the output terminal of the AND gate 312, and an output terminal. The inverter 313 includes an input terminal configured to receive the mode signal MODE, and an output terminal. The AND gate 316 includes a first input terminal coupled to the output terminal of the OR gate 315, a second input terminal configured to receive the reverse signal of the mode signal MODE, and an output terminal. The AND gate 317 includes a first input terminal configured to receive the mode signal MODE, a second input terminal configured to receive the trigger signal TGA, and an output terminal. The OR gate 318 includes a first input terminal coupled to the output terminal of the AND gate 316, a second input terminal coupled to the output terminal of the AND gate 317, and an output terminal for outputting the start signal Son.

When the mode signal MODE is enabled, the power converter 1 may perform a single-phase operation, and the start signal Son may be the trigger signal TGA after a gate delay. When the mode signal MODE is disabled and the loop signal CLP is enabled, the power converter 1 may perform two-phase operation, and the start signal Son may be the trigger signal TGB after a gate delay. When the mode signal MODE is disabled and the loop signal CLP is disabled, the power converter 1 may operate in a non-regulated mode, and the initial signal Son may be the trigger signal TG2 after a gate delay.

The phase circuit 807 may include AND gates 410, 412, 421, and 422, an OR gate 415, a NOR gate 425, a flip-flop 420, a pulse generator 430, and an inverter 411. The AND gate 410 includes a first input terminal configured to receive the trigger signal TGA, a second input terminal configured to receive the closed-loop signal CLP, and an output terminal configured to output the result of an AND operation of the trigger signal TGA and the closed-loop signal CLP. The inverter 411 includes an input terminal configured to receive the closed-loop signal CLP, and an output terminal configured to output the inverse of the closed-loop signal CLP. The AND gate 412 includes a first input terminal coupled to the output terminal of the inverter and configured to receive the inverse of the closed-loop signal CLP, a second input terminal configured to receive the trigger signal TG1, and an output terminal configured to output the result of an AND operation of the trigger signal TG1 and the inverse of the closed-loop signal CLP.

The OR gate 415 includes a first input terminal coupled to the output terminal of the AND gate 410 and configured to receive the output of the AND gate 410, a second input terminal coupled to the output terminal of the AND gate 412 and configured to receive the output of the AND gate 412, and an output terminal configured to output the result of an OR operation. The AND gate 421 includes a first input terminal configured to receive the phase signal P2, a second input terminal configured to receive the zero-crossing signal SZ, and an output terminal configured to output the result of an AND operation of the phase signal P2 and the zero-crossing signal SZ. The AND gate 422 includes a first input terminal configured to receive the phase signal P2, a second input terminal configured to receive the feedback signal SFB, and an output terminal configured to output the result of an AND operation of the phase signal P2 and the feedback signal SFB. The NOR gate 425 includes a first input terminal coupled to the output terminal of the AND gate 421, a second input terminal coupled to the output terminal of the AND gate 422, and an output terminal configured to output the result of an NOR operation.

The flip-flop 420 includes an input terminal configured to receive the supply voltage Vcc, a clock terminal coupled to the output terminal of the OR gate 415 and configured to receive the output of the OR gate 415, and a reset terminal coupled to the output terminal of the NOR gate 425, an output terminal configured to output the phase signal P1, and an inverse output terminal configured to output the inverse of the phase signal P1. The pulse generator 430 includes an input terminal configured to receive the inverse of the phase signal P2, and an output terminal configured to output the trigger signal TG2.

The phase circuit 808 may include an AND gate 441, a NAND gate 442, a flip-flop 443 and a pulse generator 445. The AND gate 441 includes a first input terminal configured to receive the closed-loop signal CLP, a second input terminal configured to receive the trigger signal TG2 and an output terminal configured to output the result of an AND operation of the closed-loop signal CLP and the trigger signal TG2. The NAND gate 442 includes a first input terminal configured to receive the stop signal SP, a second input terminal configured to receive the phase signal PB, and an output terminal configured to output the result of an NAND operation of the stop signal SP and the phase signal PB. The flip-flop 443 includes a data input terminal configured to receive the supply voltage Vcc, a clock terminal configured to receive the output of the AND gate 441, a reset terminal configured to receive the output of the NAND gate 442, an output terminal configured to output the phase signal PB, and an inverse output terminal configured to output the inverse of the phase signal PB. The pulse generator 445 includes an input terminal configured to receive the inverse of the phase signal PB, and an output terminal configured to output the trigger signal TGB.

When the closed-loop signal CLP is at the low voltage VL, the AND gate 410 is disabled, the flip-flop 420 may be triggered by the trigger signal TG1 to generate the phase signal P2, and the phase signal P2 may be reset by the zero-crossing signal SZ. When the closed-loop signal CLP is at the high voltage VH, the AND gate 412 is disabled, the flip-flop 420 may be triggered by the trigger signal TGA to generate the phase signal P2, and the phase signal P2 may be reset by the zero-crossing signal SZ and/or the feedback signal SFB. The pulse generator 430 may be used to generate a dead-time delay for the trigger signal TG2. The longer the dead-time delay of the trigger signal TG2 is, the more the start time of the phase signal P1/PB will be delayed, increasing the dead-time delay between the end time of the phase signal P2 and the start time of the phase signal P1/PB.

When the closed-loop signal CLP is at the low voltage VL, the phase circuit 808 is disabled. When the closed-loop signal CLP is at the high voltage VH, the phase circuit 808 is enabled, the flip-flop 443 may be triggered by the trigger signal TG2 to generate the phase signal PB, and the phase signal PB may be reset by the stop signal SP. The pulse generator 445 may be used to generate the dead-time delay of the trigger signal TGB. The longer the dead-time delay of the trigger signal TGB is, the more the start time of the phase signal PB will be delayed, increasing the dead-time delay between the end time of the phase signal PB and the start time of the phase signal P1.

When the power converter 1 is in a light load condition, the control circuit 800 may further set the pulse generators 330, 345, 440 and 445 to increase the dead-time delays for the trigger signals TG1, TGA, TG2 and TGB, thereby increasing the OFF times of the switches 10, 20, 30 and 40, thereby saving power.

The embodiments of the invention are used to control the power converter 1 to operate in the non-regulated mode or the regulated mode to achieve ZVS and ZCS, preventing the load from being damaged while reducing the switching loss and enhancing the system efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power converter comprising:
   a first switch comprising a control terminal, a first terminal configured to receive an input voltage, and a second terminal;
   a second switch comprising a control terminal, a first terminal coupled to the second terminal of the first switch, and a second terminal;
   a third switch comprising a control terminal, a first terminal coupled to the second terminal of the second switch, and a second terminal;
   a fourth switch comprising a control terminal, a first terminal coupled to the second terminal of the third switch, and a second terminal coupled to a ground terminal;
   a flying capacitor comprising a first terminal coupled to the second terminal of the first switch, and a second terminal coupled to the second terminal of the third switch;
   an inductor comprising a first terminal coupled to the second terminal of the second switch, and a second terminal;
   an output capacitor comprising a first terminal coupled to the second terminal of the inductor and configured to output an output voltage, and a second terminal coupled to the ground terminal; and
   a control circuit coupled to the first terminal of the first switch, the control terminal of the first switch, the control terminal of the second switch, the control terminal of the third switch and the control terminal of the fourth switch, and configured to switch the first switch, the second switch, the third switch and the fourth switch according to a resonant frequency in a non-regulated mode, and switch the first switch, the second switch, the third switch and the fourth switch according to a regulated frequency exceeding the resonant frequency in a regulated mode;
   wherein, when the flying capacitor is coupled to the inductor, the flying capacitor and the inductor form a resonant circuit having the resonant frequency.

2. The power converter of claim 1, wherein when the input voltage is between a high voltage threshold and a low voltage threshold, the control circuit is configured to be operated in the non-regulated mode, and switch the first switch, the second switch, the third switch and the fourth switch when an inductor current of the inductor is 0, so as to generate a divided voltage of the input voltage as the output voltage.

3. The power converter of claim 1, wherein the control circuit is configured to switch the first switch, the second switch, the third switch and/or the fourth switch when an inductor current of the inductor flows from the second terminal of the inductor to the first terminal of the inductor.

4. The power converter of claim 1, wherein when the input voltage is less than a low voltage threshold, the power converter is configured to perform a single-phase operation in the regulated mode, so as to regulate the output voltage to be less than or equal to the input voltage.

5. The power converter of claim 4, wherein in the single-phase operation, the control circuit is configured to turn off the third switch and the fourth switch at a first predetermined delay after an inductor current of the inductor reaches 0.

6. The power converter of claim 5, wherein in the single-phase operation, the control circuit is configured to turn on the first switch and the second switch at a second predetermined delay after the third switch and the fourth switch are turned off.

7. The power converter of claim 1, wherein when the input voltage exceeds a high voltage threshold, the power converter is configured to perform a two-phase operation in the regulated mode, so as to regulate the output voltage to be less than or equal to half the input voltage, the high voltage threshold being higher than a low voltage threshold.

8. The power converter of claim 7, wherein in the two-phase operation mode:
   the flying capacitor and the output capacitor are charged via the inductor when the first switch and the third switch are turned on; and
   the flying capacitor is configured to charge the output capacitor via the inductor when the second switch and the fourth switch are turned on.

9. The power converter of claim 1, wherein in the regulated mode, the control circuit is configured to reduce an ON time of the first switch and the second switch.

10. The power converter of claim 1, wherein in the regulated mode, the control circuit is configured to turn off the first switch, the second switch, the third switch, and/or the fourth switch before an inductor current of the inductor reaches 0.

11. The power converter of claim 1, wherein in the regulated mode, the control circuit is configured to turn off the first switch, the second switch, the third switch, and/or the fourth switch when an inductor current of the inductor reaches 0.

12. The power converter of claim 1, wherein in the regulated mode, the control circuit is configured to turn off the first switch, the second switch, the third switch, and/or the fourth switch after an inductor current of the inductor reaches 0.

13. The power converter of claim 1, wherein the power converter is operated in a discontinuous conduction mode (DCM).

14. The power converter of claim 1, wherein the control circuit comprises:
  a first phase circuit configured to generate a first phase signal and a first trigger signal according to a start signal, a zero-crossing signal and a feedback signal;
  a second phase circuit coupled to the first phase circuit and configured to generate a second phase signal and a second trigger signal according to the first trigger signal, a closed-loop signal and a stop signal;
  a third phase circuit coupled to the second phase circuit and configured to generate a third phase signal and a third trigger signal according to the first trigger signal, the second trigger signal, the closed-loop signal, the zero-crossing signal and the feedback signal;
  a fourth phase circuit coupled to the third phase circuit and the first phase circuit and configured to generate a fourth phase signal and a fourth trigger signal according to the third trigger signal, the closed-loop signal and the stop signal;
  a start circuit coupled to the first phase circuit, the second phase circuit, the third phase circuit and the fourth phase circuit, and configured to generate the start signal according to a mode signal, the closed-loop signal, the second trigger signal, the third trigger signal and the fourth trigger signal;
  a signal generation circuit coupled to the first phase circuit, the second phase circuit, the third phase circuit and the fourth phase circuit, and configured to generate a first switch signal, a second switch signal, a third switch signal and a fourth switch signal according to the first phase signal, the second phase signal, the third phase signal, the fourth phase signal and the mode signal, the first phase signal, the second phase signal, the third phase signal, and the fourth phase signal being configured to switch the first switch, the second switch, the third switch and the fourth switch, respectively;
  a feedback circuit coupled to the first phase circuit, the third phase circuit and the first terminal of the output capacitor, and configured to generate the feedback signal according to the first phase signal, the third phase signal, the output voltage and a reference voltage;
  a state detection circuit coupled to the first terminal of the output capacitor and the first terminal of the inductor, and configured to generate the zero-crossing signal and the stop signal according to the output voltage, a demagnetizing reference voltage and a switching voltage at the first terminal of the inductor; and
  a closed-loop circuit coupled to the state detection circuit, the feedback circuit, the first phase circuit and the third phase circuit, and configured to generate the closed-loop signal according to the zero-crossing signal, the feedback signal, the first phase signal and the third phase signal.

15. The power converter of claim 14, wherein:
the first phase circuit comprises:
  a first AND gate comprising:
    a first input terminal configured to receive the first phase signal;
    a second input terminal configured to receive the zero-crossing signal; and
    an output terminal;
  a second AND gate comprising:
    a first input terminal configured to receive the first phase signal;
    a second input terminal configured to receive the feedback signal; and
    an output terminal;
  a first NOR gate comprising:
    a first input terminal coupled to the output terminal of the first AND gate;
    a second input terminal coupled to the output terminal of the second AND gate; and
    an output terminal;
  a first flip-flop comprising:
    an input terminal configured to receive a supply voltage;
    a clock terminal configured to receive the start signal;
    a reset terminal coupled to the output terminal of the first NOR gate;
    an output terminal configured to output the first phase signal; and
    an inverse output terminal configured to output an inverse of the first phase signal; and
  a first pulse generator comprising:
    an input terminal configured to receive the inverse of the first phase signal; and
    an output terminal configured to output the first trigger signal;
the second phase circuit comprises:
  a third AND gate comprising:
    a first input terminal configured to receive the closed-loop signal;
    a second input terminal configured to receive the first trigger signal; and
    an output terminal;
  a first NAND gate comprising:
    a first input terminal configured to receive the stop signal;
    a second input terminal configured to receive the second phase signal; and
    an output terminal;
  a second flip-flop comprising:
    an input terminal configured to receive the supply voltage;
    a clock terminal coupled to the output terminal of the third AND gate;
    a reset terminal coupled to the output terminal of the first NAND gate;
    an output terminal configured to output the second phase signal; and
    an inverse output terminal configured to output an inverse of the second phase signal; and
  a second pulse generator comprising:
    an input terminal configured to receive the inverse of the second phase signal; and
    an output terminal configured to output the second trigger signal; and
the start circuit comprises:
  a first inverter comprising:
    an input terminal configured to receive the closed-loop signal; and
    an output terminal;

a fourth AND gate comprising:
  a first input terminal configured to receive the fourth trigger signal;
  a second input terminal configured to receive the closed-loop signal; and
  an output terminal;
a fifth AND gate comprising:
  a first input terminal configured to receive an inverse of the closed-loop signal;
  a second input terminal configured to receive the third trigger signal; and
  an output terminal;
a first OR gate comprising:
  a first input terminal coupled to the output terminal of the fourth AND gate;
  a second input terminal coupled to the output terminal of the fifth AND gate; and
  an output terminal;
a second inverter comprising:
  an input configured to receive the mode signal; and
  an output terminal configured to output an inverse of the mode signal;
a sixth AND gate comprising:
  a first input terminal coupled to the output terminal of the first OR gate;
  a second input terminal configured to receive the inverse of the mode signal; and
  an output terminal;
a seventh AND gate comprising:
  a first input terminal configured to receive the mode signal;
  a second input terminal configured to receive the second trigger signal; and
  an output terminal; and
a second OR gate comprising:
  a first input terminal coupled to the output terminal of the sixth AND gate;
  a second input terminal coupled to the output terminal of the seventh AND gate; and
  an output terminal configured to output the start signal.

16. The power converter of claim 14, wherein:
the third phase circuit comprises:
  a first AND gate comprising:
    a first input terminal configured to receive the third phase signal;
    a second input terminal configured to receive the zero-crossing signal; and
    an output terminal;
  a second AND gate comprising:
    a first input terminal configured to receive the third phase signal;
    a second input terminal configured to receive the feedback signal; and
    an output terminal;
  a first NOR gate comprising:
    a first input terminal coupled to the output terminal of the first AND gate;
    a second input terminal coupled to the output terminal of the second AND gate; and
    an output terminal;
  a first inverter comprising:
    an input terminal configured to receive the closed-loop signal; and
    an output terminal;
  a fourth AND gate comprising:
    a first input terminal configured to receive the second trigger signal;
    a second input terminal configured to receive the closed-loop signal; and
    an output terminal;
  a fifth AND gate comprising:
    a first input terminal coupled to the output terminal of the first inverter;
    a second input terminal configured to receive the first trigger signal; and
    an output terminal;
  a first OR gate comprising:
    a first input terminal coupled to the output terminal of the fourth AND gate;
    a second input terminal coupled to the output terminal of the fifth AND gate; and
    an output terminal;
  a first flip-flop comprising:
    an input terminal configured to receive a supply voltage;
    a clock terminal coupled to the output terminal of the first OR gate;
    a reset terminal coupled to the output terminal of the first NOR gate;
    an output terminal configured to output the third phase signal; and
    an inverse output terminal configured to output an inverse of the third phase signal; and
  a first pulse generator comprising:
    an input terminal configured to receive the inverse of the third phase signal; and
    an output terminal configured to output the third trigger signal; and
the fourth phase circuit comprises:
  a third AND gate comprising:
    a first input terminal configured to receive the closed-loop signal;
    a second input terminal configured to receive the third trigger signal; and
    an output terminal;
  a first NAND gate comprising:
    a first input terminal configured to receive the stop signal;
    a second input terminal configured to receive the fourth phase signal; and
    an output terminal;
  a second flip-flop comprising:
    an input terminal configured to receive the supply voltage;
    a clock terminal coupled to the output terminal of the third AND gate;
    a reset terminal coupled to the output terminal of the first NAND gate;
    an output terminal configured to output the fourth phase signal; and
    an inverse output terminal configured to output an inverse of the fourth phase signal; and
  a second pulse generator comprising:
    an input terminal configured to receive the inverse of the fourth phase signal; and
    an output terminal configured to output the fourth trigger signal.

17. The power converter of claim 14, wherein:
the signal generation circuit comprises:
a first buffer comprising:
an input terminal configured to receive the first phase signal; and
an output terminal configured to output the first switch signal;
a first inverter comprising:
an input configured to receive the mode signal; and
an output terminal;
a first AND gate comprising:
a first input terminal configured to receive the third phase signal;
a second input terminal coupled to the output terminal of the first inverter; and
an output terminal;
a second AND gate comprising:
a first input terminal configured to receive the mode signal;
a second input terminal configured to receive the first phase signal; and
an output terminal;
a first OR gate comprising:
a first input terminal coupled to the output terminal of the first AND gate;
a second input terminal coupled to the output terminal of the second AND gate; and
an output terminal;
a second buffer comprising:
an input terminal coupled to the output terminal of the first OR gate; and
an output terminal configured to output the second switch signal;
a second OR gate comprising:
a first input terminal configured to receive the first phase signal;
a second input terminal configured to receive the second phase signal;
a third input terminal configured to receive the fourth phase signal; and
an output terminal;
a second inverter comprising:
an input configured to receive the mode signal; and
an output terminal;
a third AND gate comprising:
a first input coupled to the output terminal of the second OR gate;
a second input terminal coupled to the output terminal of the second inverter; and
an output terminal;
a fourth AND gate comprising:
a first input terminal configured to receive the mode signal;
a second input terminal configured to receive the second phase signal; and
an output terminal;
a third OR gate comprising:
a first input terminal coupled to the output terminal of the third AND gate;
a second input terminal coupled to the output terminal of the fourth AND gate; and
an output terminal;
a third buffer comprising:
an input terminal coupled to the output terminal of the third OR gate; and
an output terminal configured to output the third switch signal;
a fourth OR gate comprising:
a first input terminal configured to receive the third phase signal;
a second input terminal configured to receive the second phase signal;
a third input terminal configured to receive the fourth phase signal; and
an output terminal;
a third inverter comprising:
an input configured to receive the mode signal; and
an output terminal;
a fifth AND gate comprising:
a first input coupled to the output terminal of the fourth OR gate;
a second input terminal coupled to the output terminal of the third inverter; and
an output terminal;
a sixth AND gate comprising:
a first input terminal configured to receive the mode signal;
a second input terminal configured to receive the second phase signal; and
an output terminal;
a fifth OR gate comprising:
a first input terminal coupled to the output terminal of the fifth AND gate;
a second input terminal coupled to the output terminal of the sixth AND gate; and
an output terminal; and
a fourth buffer comprising:
an input terminal coupled to the output terminal of the fifth OR gate; and
an output terminal configured to output the fourth switch signal.

18. The power converter of claim 14, wherein:
the feedback circuit comprises:
a first NOR gate comprising:
a first input terminal configured to receive the first phase signal;
a second input terminal configured to receive the third phase signal; and
an output terminal;
a current source comprising:
a first terminal coupled to a supply terminal configured to receive a supply voltage; and
a second terminal;
a transistor comprising:
a control terminal coupled to the output terminal of the first NOR gate;
a first terminal coupled to the second terminal of the current source; and
a second terminal coupled to a ground terminal;
a first capacitor comprising:
a first terminal coupled to the first terminal of the transistor; and
a second terminal coupled to the ground terminal;
a first resistor comprising:
a first terminal configured to receive the output voltage; and
a second terminal;
a second resistor comprising:
a first terminal coupled to the second terminal of the first resistor; and
a second terminal coupled to the ground terminal;
a third resistor comprising:
a first terminal configured to receive the reference voltage; and
a second terminal;

a fourth resistor comprising:
   a first terminal coupled to the second terminal of the third resistor; and
   a second terminal;
a switch comprising:
   a control terminal configured to receive the closed-loop signal;
   a first terminal coupled to the second terminal of the fourth resistor; and
   a second terminal coupled to the ground terminal;
an error amplifier comprising:
   an inverting terminal coupled to the second terminal of the first resistor;
   a non-inverting terminal coupled to the second terminal of the third resistor; and
   an output terminal;
a fifth resistor comprising:
   a first terminal coupled to the output terminal of the error amplifier; and
   a second terminal;
a second capacitor comprising:
   a first terminal coupled to the second terminal of the fifth resistor; and
   a second terminal coupled to the ground terminal; and
a comparator comprising:
   a non-inverting terminal coupled to the first terminal of the first capacitor;
   an inverting terminal coupled to the first terminal of the fifth resistor; and
   an output terminal configured to output the feedback signal.

19. The power converter of claim 14, wherein:
the state detection circuit comprises:
   a first comparator comprising:
      a non-inverting terminal configured to receive the switching voltage;
      an inverting terminal configured to receive the output voltage; and
      an output terminal;
   a zero-crossing detector comprising:
      an input terminal coupled to the output terminal of the first comparator; and
      an output terminal configured to output the zero-crossing signal;
   a second comparator comprising:
      a non-inverting terminal configured to receive the switching voltage;
      an inverting input configured to receive the demagnetizing reference voltage; and
      an output terminal configured to output a demagnetizing signal;
   a first pulse generator comprising:
      an enable terminal configured to receive a control signal;
      an input terminal configured to receive the demagnetizing signal; and
      an output terminal; and
   a first AND gate comprising:
      a first input terminal configured to receive the demagnetizing signal;
      a second input terminal coupled to the output terminal of the first pulse generator; and
      an output terminal configured to output the stop signal; and the closed-loop circuit comprises:
   a first inverter comprising:
      an input configured to receive the zero-crossing signal; and
      an output terminal configured to output an inverse of the zero-crossing signal;
   a first OR gate comprising:
      a first input terminal configured to receive the first phase signal;
      a second input terminal configured to receive the third phase signal; and
      an output terminal;
   a second pulse generator comprising:
      an input terminal coupled to the output terminal of the first OR gate; and
      an output terminal configured to output a first pulse signal;
   a second inverter comprising:
      an input terminal configured to receive the first pulse signal; and
      an output terminal configured to output a reset signal; and
   a flip-flop comprising:
      an input terminal configured to receive the inverse of the zero-crossing signal;
      a clock terminal configured to receive the feedback signal;
      a reset terminal configured to receive the reset signal; and
      an output terminal configured to output the closed-loop signal.

20. A method of controlling a power converter, the power converter comprising a first switch, a second switch, a third switch, a fourth switch, a flying capacitor, an inductor, an output capacitor and a control circuit, the first switch comprising a control terminal, a first terminal configured to receive an input voltage, and a second terminal, the second switch comprising a control terminal, a first terminal coupled to the second terminal of the first switch, and a second terminal, the third switch comprising a control terminal, a first terminal coupled to the second terminal of the second switch, and a second terminal, the fourth switch comprising a control terminal, a first terminal coupled to the second terminal of the third switch, and a second terminal coupled to a ground terminal, the flying capacitor comprising a first terminal coupled to the second terminal of the first switch, and a second terminal coupled to the second terminal of the third switch, the inductor comprising a first terminal coupled to the second terminal of the second switch, and a second terminal, the output capacitor comprising a first terminal coupled to the second terminal of the inductor and configured to output an output voltage, and a second terminal coupled to the ground terminal, and the control circuit coupled to the first terminal of the first switch, the control terminal of the first switch, the control terminal of the second switch, the control terminal of the third switch and the control terminal of the fourth switch, the method comprising:
   in a non-regulated mode, the control circuit switching the first switch, the second switch, the third switch and the fourth switch according to a resonant frequency; and
   in a regulated mode, the control circuit switching the first switch, the second switch, the third switch and the fourth switch according to a regulated frequency exceeding the resonant frequency;

wherein, when the flying capacitor is coupled to the inductor, the flying capacitor and the inductor form a resonant circuit having the resonant frequency.

21. The method of claim 20, wherein the control circuit is configured to switch the first switch, the second switch, the third switch and/or the fourth switch when an inductor current of the inductor flows from the second terminal of the inductor to the first terminal of the inductor.

22. The method of claim 20, wherein when the input voltage is less than a low voltage threshold, the power converter is configured to perform a single-stage operation in the regulated mode, so as to regulate the output voltage to be less than or equal to the input voltage; and the control circuit switching the first switch, the second switch, the third switch and the fourth switch according to the regulated frequency exceeding the resonant frequency comprises:

the control circuit turning off the third switch and the fourth switch at a first predetermined time after an inductor current of the inductor reaches 0; and the control circuit turning on the first switch and the second switch at a second predetermined delay after the third switch and the fourth switch are turned off.

23. The method of claim 20, wherein when the input voltage exceeds a high voltage threshold, the power converter is configured to perform a two-phase operation in the regulated mode, so as to regulate the output voltage to be less than or equal to half the input voltage, the high voltage threshold being higher than a low voltage threshold; and the control circuit switching the first switch, the second switch, the third switch and the fourth switch according to the regulated frequency exceeding the resonant frequency comprises:

charging the flying capacitor and the output capacitor via the inductor when the first switch and the third switch are turned on; and the flying capacitor charging the output capacitor via the inductor when the second switch and the fourth switch are turned on.

24. The method of claim 20, wherein the control circuit switching the first switch, the second switch, the third switch and the fourth switch according to the regulated frequency exceeding the resonant frequency comprises:

the control circuit turning off the first switch, the second switch, the third switch and/or the fourth switch before an inductor current of the inductor reaches 0.

25. The method of claim 20, wherein the control circuit switching the first switch, the second switch, the third switch and the fourth switch according to the regulated frequency exceeding the resonant frequency comprises:

the control circuit turning off the first switch, the second switch, the third switch and/or the fourth switch when an inductor current of the inductor reaches 0.

26. The method of claim 20, wherein the control circuit switching the first switch, the second switch, the third switch and the fourth switch according to the regulated frequency exceeding the resonant frequency comprises:

the control circuit turning off the first switch, the second switch, the third switch and/or the fourth switch after an inductor current of the inductor reaches 0.

* * * * *